United States Patent
Kitakado et al.

(10) Patent No.: US 9,093,541 B2
(45) Date of Patent: Jul. 28, 2015

(54) THIN FILM TRANSISTOR AND DISPLAY DEVICE

(75) Inventors: Hidehito Kitakado, Osaka (JP); Sumio Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/002,211

(22) PCT Filed: Feb. 23, 2012

(86) PCT No.: PCT/JP2012/054403
§ 371 (c)(1),
(2), (4) Date: Sep. 6, 2013

(87) PCT Pub. No.: WO2012/117936
PCT Pub. Date: Sep. 7, 2012

(65) Prior Publication Data
US 2014/0035478 A1    Feb. 6, 2014

(30) Foreign Application Priority Data
Mar. 1, 2011    (JP) ................. 2011-044496

(51) Int. Cl.
*H01L 29/10*    (2006.01)
*H01L 29/786*    (2006.01)
(Continued)

(52) U.S. Cl.
CPC ............ *H01L 29/7869* (2013.01); *H01L 29/45* (2013.01); *H01L 29/66742* (2013.01); *H01L 29/66969* (2013.01); *H01L 29/78618* (2013.01); *H05B 37/02* (2013.01)

(58) Field of Classification Search
CPC ..................... H01L 29/7869; H01L 29/66742; H01L 29/78618

USPC ................. 257/43, 59, 72; 438/104, 159, 163
See application file for complete search history.

(56) References Cited

U.S. PATENT DOCUMENTS

| | | | |
|---|---|---|---|
| 2007/0187760 A1* | 8/2007 | Furuta et al. | 257/347 |
| 2008/0067508 A1 | 3/2008 | Endo et al. | |

(Continued)

FOREIGN PATENT DOCUMENTS

| | | |
|---|---|---|
| JP | 2007-298602 A | 11/2007 |
| JP | 2008-072025 A | 3/2008 |

(Continued)

OTHER PUBLICATIONS

Official Communication issued in International Patent Application No. PCT/JP2012/054403, mailed on May 29, 2012.

*Primary Examiner* — Tu-Tu Ho
(74) *Attorney, Agent, or Firm* — Keating & Bennett, LLP

(57) ABSTRACT

The invention provides a thin film transistor having current driving force that can be substantially improved. By heat treatment, the IGZO layer (45) from which oxygen is taken away by the titanium electrodes (65) becomes the low resistance regions (40*b*), and the IGZO layer (45) from which oxygen is not taken away remains as the high resistance region (40*a*). In this state, when the gate voltage is applied to the gate electrode (20), electrons in the low resistance regions (40*b*) near the boundaries with the high resistance region (40*a*) move respectively to the titanium electrode (65) sides. As a result, the length of the low resistance regions (40*b*) becomes short, and oppositely, the length of the high resistance region (40*a*) becomes longer by the size of the shortened low resistance regions. However, the electrical channel length (Le) becomes shorter than the source/drain interval space (Lch) as the limit resolution of the exposure device, and the current driving force becomes large.

18 Claims, 20 Drawing Sheets

(51) Int. Cl.
*H01L 29/66* (2006.01)
*H05B 37/02* (2006.01)
*H01L 29/45* (2006.01)

(56) References Cited

U.S. PATENT DOCUMENTS

| | | |
|---|---|---|
| 2008/0136990 A1* | 6/2008 | Kimura ............................ 349/46 |
| 2008/0197350 A1 | 8/2008 | Park et al. |
| 2010/0176388 A1 | 7/2010 | Ha et al. |
| 2010/0193782 A1 | 8/2010 | Sakata |
| 2010/0224873 A1 | 9/2010 | Sakata et al. |
| 2010/0304529 A1 | 12/2010 | Sasaki et al. |
| 2011/0031499 A1 | 2/2011 | Kimura et al. |
| 2011/0042670 A1 | 2/2011 | Sato et al. |
| 2011/0057186 A1* | 3/2011 | Yamazaki et al. .............. 257/43 |

FOREIGN PATENT DOCUMENTS

| | | |
|---|---|---|
| JP | 2008-205469 A | 9/2008 |
| JP | 2009-272427 A | 11/2009 |
| JP | 2010-045263 A | 2/2010 |
| JP | 2010-161373 A | 7/2010 |
| JP | 2010-232647 A | 10/2010 |
| JP | 2011-009728 A | 1/2011 |
| KR | 10-2011-0015388 A | 2/2011 |
| TW | 201044581 A1 | 12/2010 |

* cited by examiner (a)

| | FILM THICKNESS OF TITANIUM | POWER AT FILM-FORMING TIME | HEAT TREATMENT CONDITION | ΔL | Le |
|---|---|---|---|---|---|
| EXPERIMENT 1 | 100nm | 2 kW | 350°C ONE HOUR | 0 μm | 5 μm |
| EXPERIMENT 2 | 30nm | 7 kW | 350°C ONE HOUR | 5 μm | 0 μm |
| EXPERIMENT 3 | 30nm | 7 kW | 300°C ONE HOUR | 3 μm | 2 μm |
| EXPERIMENT 4 | 70nm | 7 kW | 300°C ONE HOUR | 2 μm | 3 μm |
| EXPERIMENT 5 | 70nm | 7 kW | 250°C ONE HOUR | 1 μm | 4 μm |
| EXPERIMENT 6 | 30nm | 7 kW | 350°C ONE HOUR | 5 μm | 2.5 μm |

(a)

(b)

(a)

(b)

(c)

(d)

(a)

(b)

(c)

(a)

(b)

(a)

(b)

(a)

(b)

(c)

(d)

(a)

(b)

(c)

THIN FILM TRANSISTOR AND DISPLAY DEVICE

TECHNICAL FIELD

The present invention relates to a thin film transistor and a manufacturing method therefor, and a display device, and particularly relates to a thin film transistor having a channel layer made of an oxide semiconductor and a manufacturing method therefor, and a display device.

BACKGROUND ART

In recent years, by focusing attention to the excellent characteristic of an oxide semiconductor made of indium gallium zinc oxide (hereinafter, referred to as "IGZO") and the like, there has been progressed the development of a thin film transistor (hereinafter, referred to as "TFT") that has the oxide semiconductor as a channel layer.

To increase the current driving force of a TFT, it is most effective to shorten the channel length. The channel length is equivalent to the length between the end part of the source electrode and the end part of the drain electrode, and this length is determined by a resolution limit of the exposure device. The resolution limit is determined by the wavelength of an exposed beam that is used in the exposure device. As the wavelength of the exposed beam is shorter, the resolution limit improves. Specifically, when the exposure device that can expose by using the g-line (a wavelength of 436 nm) and the h-line (a wavelength of 405 nm), (hereinafter, referred to as "g-line+h-line exposure device"), is used, the resolution limit is 3 µm. On the other hand, when the exposure device that can expose by using the i-line (a wavelength of 365 nm), (hereinafter, referred to as "i-line exposure device"), is used, the resolution limit improves to 1.5 µm. Accordingly, a channel length of the TFT taking the variation in the photolithography process into account can be shortened to about 2 µm when the i-line exposure device is used, while a channel length is about 4 µm when the g-line+h-line exposure device is used.

However, the i-line exposure device is more expensive than the g-line+h-line exposure device, and a large-type i-line exposure device that can expose a large-type substrate becomes more expensive. Therefore, to reduce as much as possible the manufacturing cost of forming a TFT on a large-type substrate of the G8 size (2200 mm×2500 mm), a large-type g-line+h-line exposure device is used in many cases instead of the large-type i-line exposure device. In this case, a channel length of the TFT becomes 3 µm to 4 µm (inclusive) as described above. Consequently, when using the g-line+h-line exposure device, a method for shortening the channel length is also required.

In Patent Document 1, to increase the current driving force of the TFT having a channel layer made of an oxide semiconductor, there is disclosed a technique of lowering the resistance of the oxide semiconductor layer by reducing the oxide semiconductor layer which is in contact with the source electrode and the drain electrode, thereby lowering the contact resistances between the source electrode and the channel layer and between the drain electrode and the channel layer.

PRIOR ART DOCUMENT

Patent Document

[Patent Document 1] Japanese Patent Application Laid-Open Publication No. 2010-232647

SUMMARY OF THE INVENTION

Problems to be Solved by the Invention

However, the low resistance regions of the channel layer are formed beneath only the lower parts of the source electrode and the drain electrode. Therefore, the channel length of the TFT is 3 µm to 4 µm (inclusive) which is the same as the length between the end part of the source electrode and the end part of the drain electrode, and accordingly, cannot be made shorter than the resolution limit of the exposure device. As a result, the current driving force of the TFT is improved by only about a few percent due to the reduction of the contact resistance values between the source electrode and the channel layer and between the drain electrode and the channel layer, and it is difficult to substantially improve the current driving force of the TFT Therefore, an object of the present invention is to provide a thin film transistor having the current driving force that can be substantially improved while suppressing the manufacturing cost, and a manufacturing method therefor. Further, another object of the present invention is to provide a display device that can achieve a high frame rate and high definition by using such a thin film transistor like this.

Solution to the Problems

A first aspect of the present invention is directed to a thin film transistor formed on an insulating substrate, comprising:
a gate electrode formed on the insulating substrate;
a gate insulating film formed to cover the gate electrode;
a source electrode and a drain electrode that are formed on the gate insulating film with a predetermined distance to sandwich the gate electrode; and
a channel layer that includes an oxide semiconductor layer which is formed on the gate insulating film sandwiched between the source electrode and the drain electrode, and one end and the other end being electrically connected respectively to the source electrode and the drain electrode, wherein
the oxide semiconductor layer has two first regions each having a first resistance value, and a second region sandwiched between the two first regions and having a second resistance value higher than the first resistance values, and
a length of the second region is shorter than a length between an end part of the source electrode and an end part of the drain electrode.

In a second aspect of the present invention, based on the first aspect of the present invention, wherein when a predetermined voltage is applied to the gate electrode, the length of the second region becomes longer by a length of the first region which becomes short.

In a third aspect of the present invention, based on the first aspect of the present invention, wherein the source electrode and the drain electrode respectively include metal electrodes made of a metal which take oxygen away from the oxide semiconductor layer and also supply hydrogen to the oxide semiconductor layer, and
the metal electrodes are in direct contact with the oxide semiconductor layer.

In a fourth aspect of the present invention, based on the first aspect of the present invention, wherein the source electrode is formed to cover one end of the oxide semiconductor layer, and the drain electrode is formed to cover the other end of the oxide semiconductor layer.

In a fifth aspect of the present invention, based on the fourth aspect of the present invention, further comprising an etching stopper layer which is formed to cover the second region, on the oxide semiconductor layer sandwiched between the end part of the source electrode and the end part of the drain electrode, and the source electrode and the drain electrode are connected respectively to the two first regions of the channel layer via contact holes formed on the etching stopper layer.

In a sixth aspect of the present invention, based on the first aspect of the present invention, wherein one end of the oxide semiconductor layer is formed to cover one end of the source electrode, and the other end of the oxide semiconductor layer is formed to cover one end of the drain electrode.

In a seventh aspect of the present invention, based on the sixth aspect of the present invention, wherein the source electrode and the drain electrode include at least one metal electrode which takes oxygen away from the oxide semiconductor layer and also supplies hydrogen to the oxide semiconductor layer, and are made of laminated metal electrodes obtained by laminating a plurality of metal electrodes, the laminated metal electrodes have stair-shaped steps that are formed to have at least a part of surfaces of the plurality of metal electrodes exposed, and one end and the other end of the oxide semiconductor layer are formed to cover the stair-shaped steps.

In a eighth aspect of the present invention, based on the third or seventh aspect of the present invention, wherein the metal electrode is a titanium electrode.

In a ninth aspect of the present invention, based on the eighth aspect of the present invention, wherein the oxide semiconductor layer is an indium gallium zinc oxide layer, and the titanium electrode is in direct contact with the indium gallium zinc oxide layer.

In a tenth aspect of the present invention, based on the ninth aspect of the present invention, wherein the length of the second region when a voltage is applied to the gate electrode is shorter than the length between the end part of the source electrode and the end part of the drain electrode by 1 μm to 3 μm (inclusive).

In a eleventh aspect of the present invention, based on the first aspect of the present invention, wherein the oxide semiconductor layer is made of a microcrystalline oxide semiconductor.

A twelfth aspect of the present invention is directed to a method for manufacturing a thin-film transistor, comprising a step of:

forming a gate electrode on the insulating substrate;

forming a gate insulating film to cover the gate electrode;

forming a channel layer made of an indium gallium zinc oxide layer, on the gate insulating film;

forming a source electrode and a drain electrode respectively, to cover one end and the other end of the channel layer; and performing heat treatment after forming the source electrode and the drain electrode, wherein the step of performing the heat treatment is a process performed for 0.5 hour to 3 hours (inclusive) at a temperature of not lower than 250° C. and not higher than 350° C.

In a thirteenth aspect of the present invention, based on the twelfth aspect of the present invention, further comprising the steps of:

forming a passivation film after forming the source electrode and the drain electrode; and forming contact holes that reach respectively the source electrode and the drain electrode, on the passivation film, wherein the step of performing the heat treatment is performed after forming the contact holes on the passivation film.

In a fourteenth aspect of the present invention, based on the twelfth aspect of the present invention, wherein the step of forming the source electrode and the drain electrode includes a step of forming a titanium film on a surface of the indium gallium zinc oxide layer by using a sputtering method, and the step of forming the titanium film is for forming the film by adjusting a film thickness of the titanium film and power at a film-forming time.

A fifteenth aspect of the present invention is directed to an active matrix-type display device that displays an image, comprising:

a display unit that has a plurality of gate wirings, a plurality of source wirings orthogonal to the plurality of gate wirings, a plurality of pixel formation portions arranged in a matrix in accordance with intersections between the plurality of gate wirings and the plurality of source wirings; and a drive circuit that drives the plurality of pixel formation portions, wherein the drive circuit is configured by the thin film transistor according to the first aspect of the present invention.

In a sixteenth aspect of the present invention, based on the fifteenth aspect of the present invention, wherein the pixel formation portions include switching elements that are turned on or off according to signals applied to corresponding gate wirings, and the switching elements include the thin film transistor according to the first aspect of the present invention.

Effects of the Invention

According to the first aspect, because the resistance value of the second region sandwiched between the two first regions that are formed in the channel layer is higher than the resistance values of the first regions, the second region functions as the channel of the thin film transistor. In accordance with the forming of the first regions, the length of the second region can be made shorter than the length between the end part of the source electrode and the end part of the drain electrode that is determined by the resolution limit of the exposure device. Accordingly, because the electrical channel length becomes short, the current driving force of the thin film transistor becomes large.

According to the second aspect, by applying a voltage to the gate electrode, the length of the second region becomes long by the shortened length of the first regions. Because the length of the second region becomes shorter than the length between the end part of the source electrode and the end part of the drain electrode, the current driving force can be made larger than that of the conventional thin film transistor.

According to the third aspect, the metal electrodes take oxygen away from the oxide semiconductor layer, and at the same time, supply hydrogen to the oxide semiconductor layer. The oxide semiconductor layer is reduced, hydrogen is spread inside this layer, and the first regions having low resistance values are formed in the oxide semiconductor layer. Accordingly, because the electrical channel length becomes short, the current driving force of the thin film transistor can be made large.

According to the fourth aspect, also in the thin film transistor of the channel etch structure, the electrical channel length is shortened by forming the first regions. Accordingly, the current driving force of the thin film transistor of the channel etch structure can be made large.

According to the fifth aspect, also in the thin film transistor of the etch stopper structure, the electrical channel length is shortened by forming the first regions. Accordingly, the current driving force of the thin film transistor of the etch stopper structure can be made large.

According to the sixth aspect, also in the thin film transistor of the bottom contact structure, the electrical channel length is shortened by forming the first regions. Accordingly, the current driving force of the thin film transistor of the bottom contact structure can be made large.

According to the seventh aspect, in the thin film transistor of the bottom contact structure, the source electrode and the drain electrode respectively have a stair-shaped step, and the surfaces of the metal electrodes that take oxygen away from the oxide semiconductor layer and also supply hydrogen to the oxide semiconductor layer are exposed on the surface of the step. The oxide semiconductor layer is reduced by the metal electrodes, and hydrogen is spread inside the oxide semiconductor layer. Accordingly, the first regions each having a low resistance value are formed at one end and at the other end of the oxide semiconductor layer that is in direct contact with the metal electrodes, and the length of the second region becomes short. As a result, because the electrical channel length becomes short, the current driving force of the thin film transistor of the bottom contact structure can be made large.

According to the eighth aspect, because the titanium layer has a high capacity of taking oxygen away from the oxide semiconductor layer and supplying hydrogen to the oxide semiconductor layer, the first regions can be easily formed in the oxide semiconductor layer. Accordingly, because the electrical channel length becomes short, the current driving force of the thin film transistor can be made large.

According to the ninth aspect, because the indium gallium zinc oxide layer can be easily reduced by the titanium electrodes, and because hydrogen can be easily spread inside this layer, the first regions can be easily formed. Accordingly, because the electrical channel length becomes short, the current driving force of the thin film transistor can be made large.

According to the tenth aspect, when the length of the second region is made shorter than the length between the end part of the source electrode and the end part of the drain electrode by 1 μm to 3 μm (inclusive), the thin film transistor can be operated normally, even when the length between the end part of the source electrode and the end part of the drain electrode is shortened to the resolution limit.

According to the eleventh aspect, because the oxide semiconductor film is made of a microcrystalline semiconductor, the on-resistance of the thin film transistor becomes small. Accordingly, the current driving force can be made large.

According to the twelfth aspect, by performing the heat treatment for 0.5 hour to 3 hours, the shift of the threshold voltage due to the gate voltage stress can be sufficiently suppressed in a short processing time. Further, by performing the heat treatment at 250° C. to 350° C., the first regions can be easily formed, and the variation of the length of the first regions can be minimized.

According to the thirteenth aspect, the heat treatment for reducing the indium gallium zinc oxide layer of the channel layer and the heat treatment for recovering from the damage received at the time of etching the contact holes can be performed by heat treatment at one time. Accordingly, the manufacturing process of the thin film transistor can be simplified.

According to the fourteenth aspect, at the time of forming, by the sputtering method, the titanium film included in the source electrode and the drain electrode, the length of the second region can be made shorter than the resolution limit of the exposure device. Therefore, a thin film transistor that has large current driving force can be formed.

According to the fifteenth aspect, by constructing the drive circuit by using the thin film transistor according to the first aspect having large current driving force, the operation speed of the drive circuit becomes fast and a high frame rate can be easily realized. Further, because the circuit scale of the drive circuit can be made small, the picture-frame of the display unit can be made small, and the power consumption of the display device can be suppressed.

According to the sixteenth aspect, by using the thin film transistor according to the first aspect as the switching element of each pixel formation portion, a signal voltage of the pixel signal can be charged to the pixel capacitance in a short time. Therefore, high definition can be realized by increasing the number of pixel formation portions.

BRIEF DESCRIPTION OF THE DRAWINGS

FIG. 10 is a table showing a relationship between various processing conditions and the length of the low resistance regions of the TFT shown in FIG. 7(a) and FIG. 7(b).

FIG. 21 is an enlarged cross-sectional view showing a state that an IGZO layer constituting the channel layer of the TFT shown in FIG. 18(a) and FIG. 18(b) is reduced by the heat treatment.

MODES FOR CARRYING OUT THE INVENTION

1. Basic Study

Figure 1:
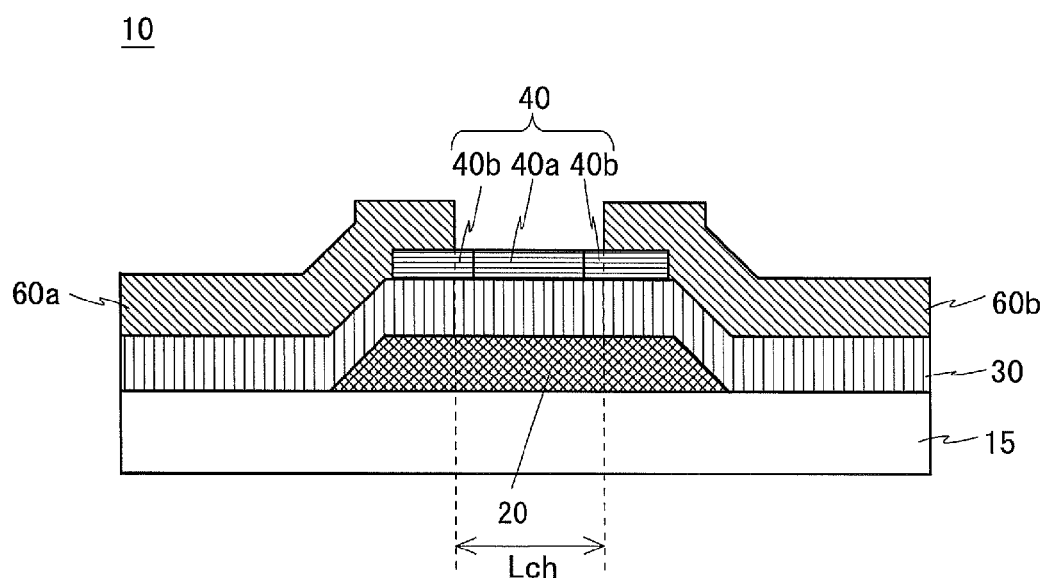
FIG. 1 is a cross-sectional view showing a configuration of a bottom-gate type TFT that is used in the basic study.

FIG. 1 is a cross-sectional view showing a configuration of a bottom-gate type TFT 10 that is used in the basic study. As shown in FIG. 1, the TFT 10 includes a gate electrode 20 formed on an insulating substrate 15, a gate insulating film 30 formed to cover the gate electrode 20, a channel layer 40 having an island shape formed on the surface of the gate insulating film 30 at a position corresponding to the gate electrode 20, a source electrode 60a extended from the left upper surface of the channel layer 40 onto the gate insulating film 30 at the left side, and a drain electrode 60b extended from the right upper surface of the channel layer 40 onto the gate insulating film 30 at the right side.

In the TFT 10, the channel layer 40 is made of an IGZO layer, and the IGZO layer is in contact with a titanium (Ti) electrode (not shown) that is contained in the source electrode 60a and the drain electrode 60b. The titanium electrodes reduce the IGZO layer by taking oxygen away from the IGZO layer as one of constituent elements of the IGZO layer, and are oxidized by the taken-in oxygen. Further, hydrogen that is contained in the titanium electrodes is supplied to the IGZO layer, and the supplied hydrogen is spread inside the IGZO layer. In this way, the IGZO layer from which oxygen is taken away and in which hydrogen is spread becomes a low resistance region, and the IGZO layer from which oxygen is not taken away and in which hydrogen is not spread remains as a high resistance region. Accordingly, low resistance regions (also referred to as "first regions") 40b are formed at both sides of the channel layer 40. Further, at the center of the channel layer 40 sandwiched between the two low resistance regions 40b, a high resistance region (also referred to as a "second region") 40a remains, and functions as a channel of the TFT 10.

However, it is difficult to obtain the size (length) of the high resistance region 40a or the low resistance regions 40b by physical analysis or chemical analysis. Further, as described later, the sizes of the low resistance regions 40b change depending on measurement of the TFT characteristic, and the size of the high resistance region 40a also changes accordingly. The channel length of the TFT 10 is obtained by the method described below.

In the TFT 10, the length of the space which is sandwiched between the end part of the source electrode 60a and the end part of the drain electrode 60b (hereinafter, referred to as "source/drain interval space") is expressed as Lch, and the channel length of the TFT 10 obtained by measuring the TFT characteristic (hereinafter, referred to as "electrical channel length") is expressed as Le. In this case, regions having a length ΔL expressed by the following equation (1) are referred to as ΔL regions.

$$\Delta L = Lch - Le \quad (1)$$

When the voltage between the source electrode 60a and the drain electrode 60b is expressed as Vds and also when the drain current is expressed as Imeas, a resistance value Rmeas between the source electrode 60a and the drain electrode 60b is expressed by the following equation (2).

$$Rmeas = Vds/Imeas \quad (2)$$

The drain current Imeas is the current per 1 μm of a channel width, and is the value obtained by dividing the total current that flows between the source electrode 60a and the drain electrode 60b by the channel width.

A resistance value Rext obtained by subtracting the resistance value of the electrical channel length Le from the resistance value Rmeas between the source electrode 60a and the drain electrode 60b is the resistance value of mainly the ΔL regions, and further includes the contact resistance values between the source electrode 60a and the channel layer 40 and between the drain electrode 60b and the channel layer 40.

Figure 2:
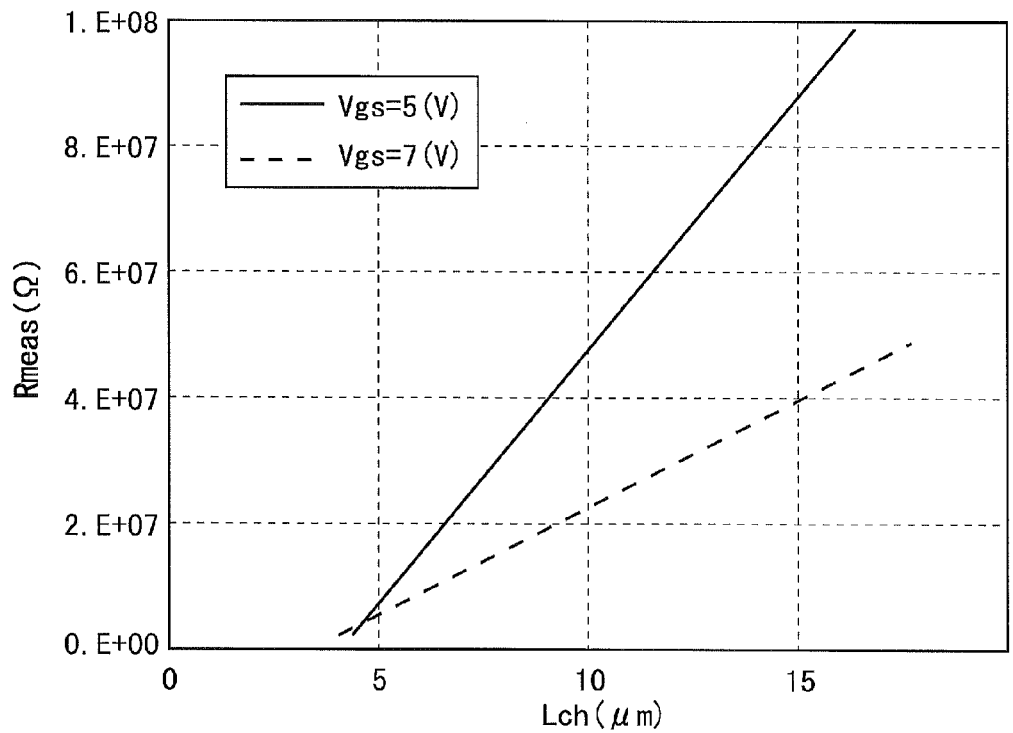
FIG. 2 is a graph showing a relationship between the length of the source/drain interval space and the resistance value between the source electrode and the drain electrode when the gate voltage is changed in a TFT shown in FIG. 1.

A method for obtaining the length ΔL of the ΔL regions and the resistance value Rext is described. FIG. 2 is a graph showing a relationship between the length Lch of the source/drain interval space and the resistance value Rmeas between the source electrode 60a and the drain electrode 60b when the gate voltage is changed. As shown in FIG. 2, from the data that expresses the channel length dependency of the TFT characteristic when 6±1 V is applied to the gate electrode 20, a straight line when the gate voltage is 5 V and a straight line when the gate voltage is 7 V are obtained. At the intersection between the two straight lines, a channel length component (lateral axis component) represents the length ΔL, and a resistance component (vertical axis component) represents the resistance value Rext.

Figure 3:
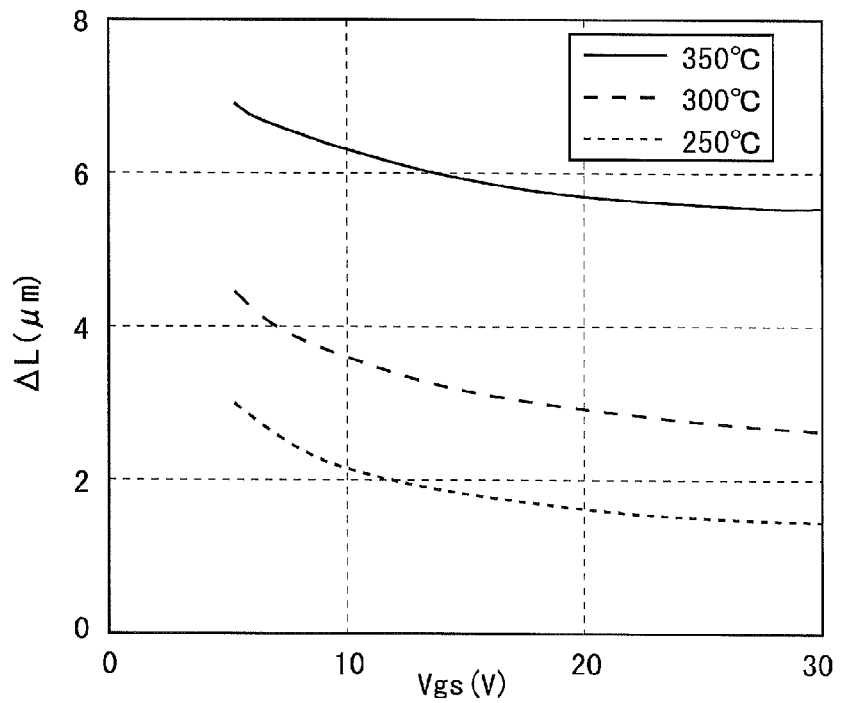
FIG. 3 is a graph showing the gate voltage dependency of the length of the ΔL regions in the TFT shown in FIG. 1.

In this way, by changing the gate voltage, the gate voltage dependencies of the length ΔL and the resistance value Rext in the ΔL regions are obtained. FIG. 3 is a graph showing the gate voltage dependency of the length ΔL of the ΔL regions. The titanium electrodes that are included in the source electrode 60a and the drain electrode 60b take oxygen away from the IGZO layer constituting the channel layer 40, reduce the IGZO layer, and are oxidized by the taken-in oxygen, by the heat treatment. Further, hydrogen that is contained in the titanium electrodes is supplied to the IGZO layer, and the supplied hydrogen is spread inside the IGZO layer. Accordingly, regions of low resistance values are formed in the channel layer 40. The regions of the low resistance values are the ΔL regions, and the length ΔL is determined by the oxygen that is taken away, and the hydrogen that is spread inside. As shown in FIG. 3, it becomes clear that the length ΔL of the ΔL regions becomes longer as the heat treatment temperature is higher.

Figure 4:
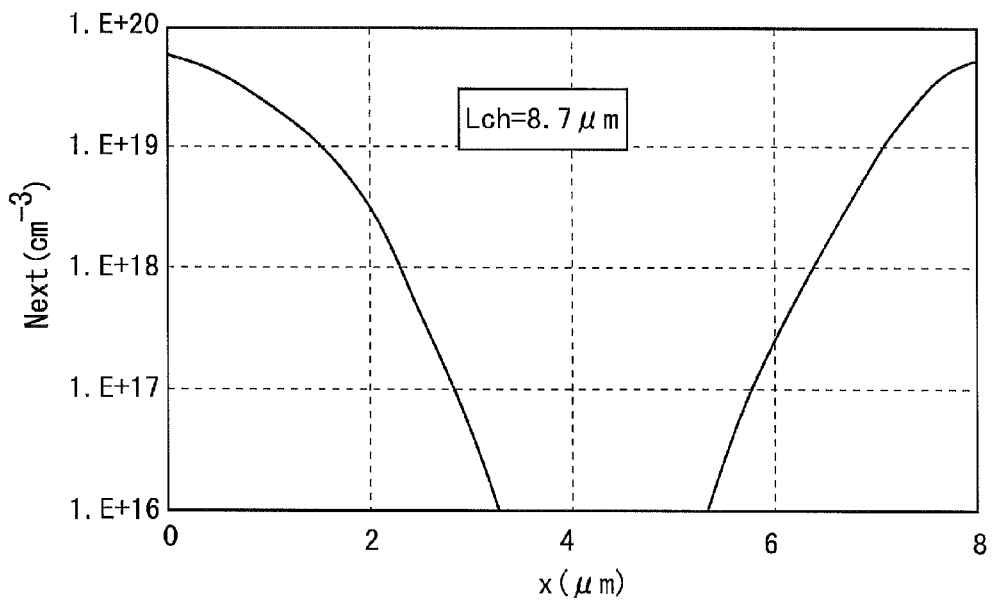
FIG. 4 is a graph showing a distribution of electron carrier concentration in the source/drain interval space in the TFT shown in FIG. 1.

FIG. 4 is a graph showing a distribution of electron carrier concentration Next in the source/drain interval space. As shown in FIG. 4, when the length Lch of the source/drain interval space is 8.7 μm, the electron carrier concentration Next is the highest at respective end parts of the source electrode and the drain electrode (at respective positions of x=0 μm and x=8 μm), and the electron carrier concentration Next becomes lower toward the inside of the source/drain interval space. As the gate voltage applied to the gate electrode 20 is set higher, the electron carrier concentration Next in the channel increases, and exceeds the concentration in the region in which the electron carrier concentration Next in the ΔL regions is low. Accordingly, because the regions in which the electron carrier concentration Next of the ΔL region is low are taken into the channel, the ΔL regions become only the regions in which the electron carrier concentration Next is high, and the length ΔL decreases. As a result, as shown in FIG. 3, the electrical channel length Le becomes long, and the length of the ΔL regions becomes short.

Figure 5:
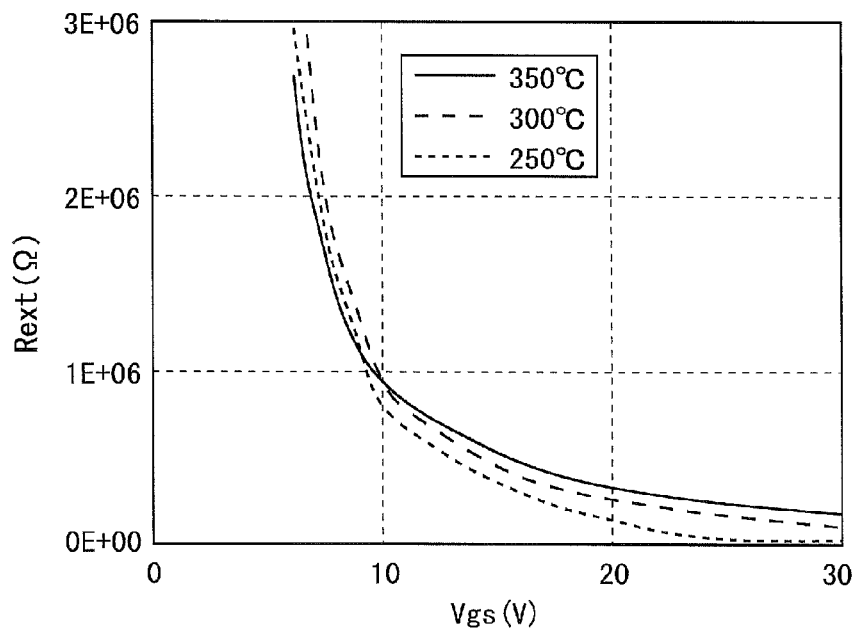
FIG. 5 is a graph showing the gate voltage dependency of the resistance value of the ΔL regions in the TFT shown in FIG. 1.

FIG. 5 is a graph showing the gate voltage dependency of the resistance value Rext in the ΔL regions. As shown in FIG. 5, when the length ΔL of the ΔL regions becomes short by increasing the gate voltage, the resistance value Rext becomes low. This is because as the gate voltage becomes high, the regions in which the electron carrier concentration Next inside the ΔL regions are low change into the channel, and the regions that contribute to the resistance value of the ΔL regions become only the regions in which the electron carrier concentration Next inside the ΔL regions is high. In the region of the high gate voltage, the resistance value Rext also becomes higher as the heat treatment temperature is higher. This is because as the heat treatment temperature is higher, the length ΔL of the ΔL regions becomes longer.

In this way, the length ΔL of the ΔL regions depends on the gate voltage. Out of the ΔL regions, the regions that contribute to drain current Imeas when the TFT 10 is in the on state are not the internal region of the channel where the electron carrier concentration Next is low, but the regions that are respectively near the end part of the source electrode 60a and the end part of the drain electrode 60b. The length ΔL of the ΔL regions in the present specification is defined as the length that is obtained from FIG. 3 when a voltage of 20 V to 30 V is applied to the gate electrode 20. The electrical channel length Le is obtained by the following equation (3), from the length Lch of the source/drain interval space and the length ΔL of the ΔL regions.

$$Le=Lch-\Delta L \quad (3)$$

The low resistance regions 40b shown in FIG. 1 are the ΔL regions, that is, the regions having the length of ΔL, and the high resistance region 40a is the region obtained by subtracting the low resistance regions 40b from the source/drain interval space, that is, the region having the length of the electrical channel length Le. As described above, by the heat treatment, the IGZO layer included in the channel layer 40 is reduced by having oxygen taken away, and the titanium electrodes that have taken in oxygen are oxidized. Further, hydrogen that is contained in the titanium electrodes is supplied to the IGZO layer. The supplied hydrogen is spread inside the IGZO layer. By the reduction of the IGZO layer and the spread of hydrogen in this way, the low resistance regions 40b of the length ΔL are formed.

When the channel layer 40 of the TFT 10 includes the IGZO layer 45 and when the source electrode 60a and the drain electrode 60b include the titanium electrodes 65, a state that an IGZO layer 45 is reduced by titanium electrodes 65 is described. FIGS. 6(a) to 6(d) are schematic cross-sectional views showing the state that the IGZO layer 45 is reduced by the titanium electrodes 65. The state that the reduction of the IGZO layer 45 is progressed is described with reference to FIGS. 6(a) to 6(d).

Figure 6:
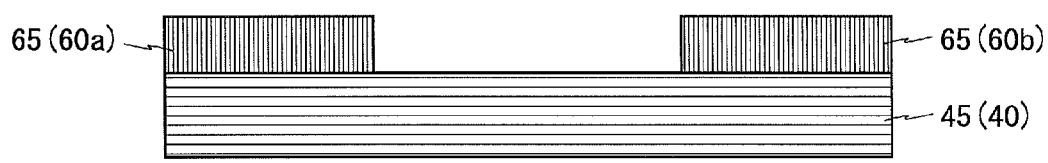
FIGS. 6(a) to 6(d) are schematic cross-sectional views showing a state that an IGZO layer is reduced by the titanium electrodes in the TFT shown in FIG. 1.
Figure 6:
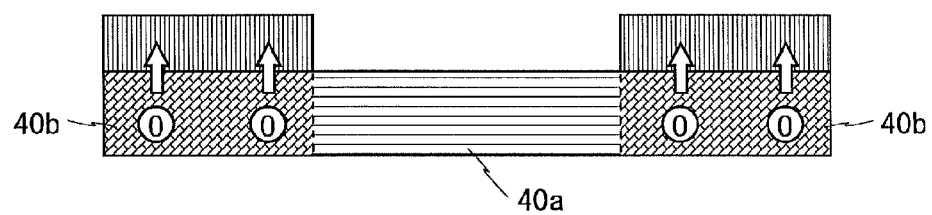
Figure 6:
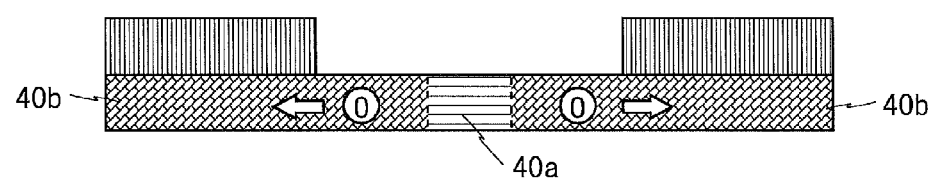
Figure 6:
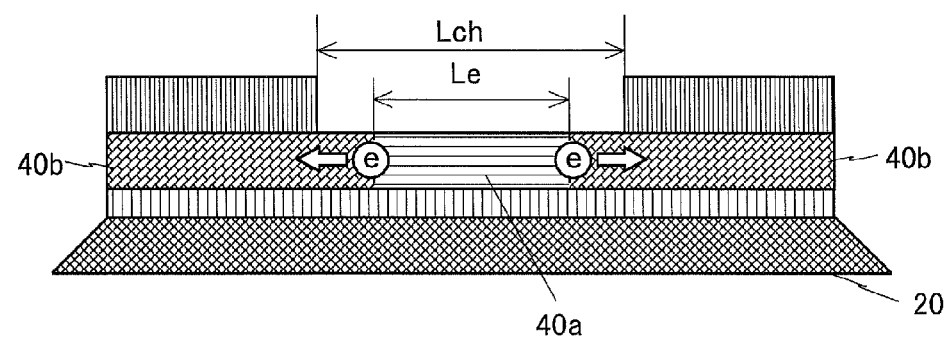

As shown in FIG. 6(a), the titanium electrodes 65 are formed on the IGZO layer 45. In this process, because the heat treatment is not performed, the IGZO layer 45 is not reduced. At this time, because the oxygen concentration in the IGZO layer 45 is high and also because the oxygen concentration in the titanium electrodes 65 is low, the oxygen concentration gradient is steeper at the interfaces between the IGZO layer 45 and the titanium electrodes 65.

As shown in FIG. 6(b), by performing the heat treatment, oxygen that is contained in the IGZO layer 45 beneath the titanium electrodes 65 is first taken away by the titanium electrodes 65. Accordingly, the IGZO layer 45 is reduced, and the titanium electrodes 65 are oxidized at the same time. The oxygen concentration in the IGZO layer 45 at portions beneath the titanium electrodes 65 is lowered because oxygen is taken away, and these portions become the low resistance regions 40b.

As shown in FIG. 6(c), oxygen that is contained in the IGZO layer 45 in the source/drain interval space with a distance from the interfaces is supplied to the interfaces in order, and is taken away by the titanium electrodes 65. The titanium electrodes 65 are oxidized by the oxygen that is taken away from the IGZO layer 45. In this way, the titanium electrodes 65 perform the reduction by taking oxygen away not only from the IGZO layer 45 beneath the titanium electrodes 65 but also from the IGZO layer 45 in the source/drain interval space. Hydrogen is supplied from the titanium electrodes 65, and is spread inside the IGZO layer 45. Therefore, the low resistance regions 40b are widened to the IGZO layer 45 in the source/drain interval space. On the other hand, a portion of the IGZO layer 45 that is not reduced remains as the high resistance region 40a.

As shown in FIG. 6(d), when the gate voltage is applied to the gate electrode 20, electrons in the low resistance regions 40b near the boundaries with the high resistance region 40a move to the titanium electrode 65 sides. Accordingly, the length of the low resistance regions 40b becomes short, and oppositely, the length of the high resistance region 40a becomes long by the size of the shortened low resistance regions 40b. In this way, the length of the high resistance region 40a when the voltage of 20 V to 30 V is applied to the gate electrode 20 becomes the electrical channel length Le. Because the electrical channel length Le is shorter than the length Lch of the source/drain interval space, the current driving force becomes larger than that of the conventional thin film transistor.

In the following embodiments, the low resistance regions are formed by the reduction after oxygen is taken away, and the description of the spread of hydrogen which is supplied from the titanium electrodes is omitted.

2. First Embodiment

2.1 Configuration of TFT

Figure 7:
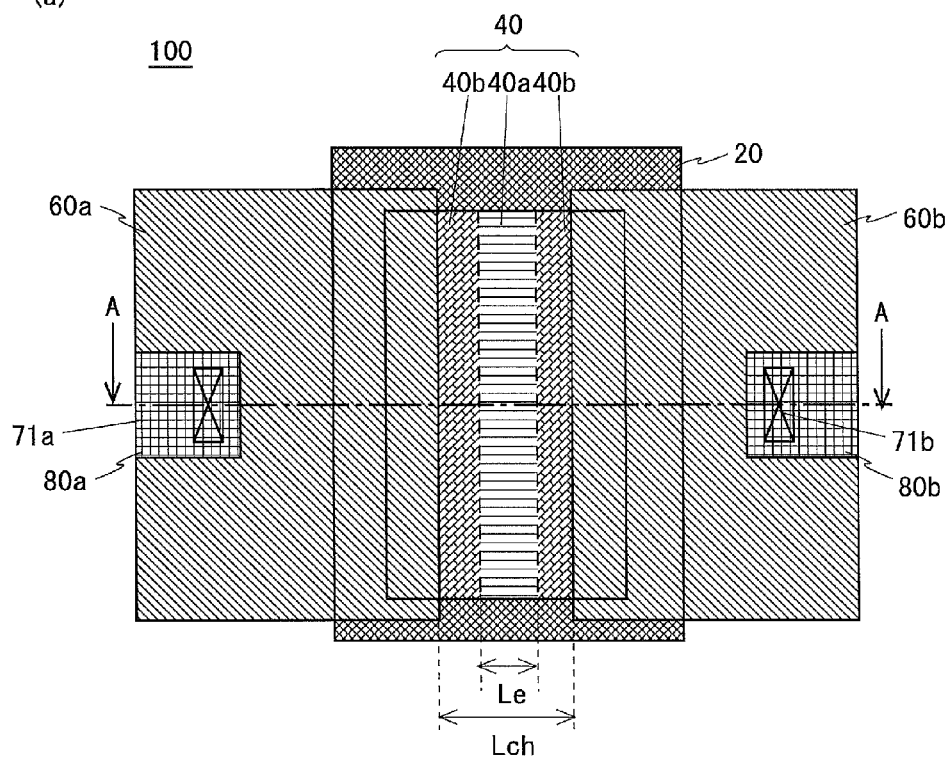
FIG. 7(a) is a plan view showing a configuration of a bottom-gate type TFT according to a first embodiment of the present invention.
FIG. 7(b) is a cross-sectional view along the A-A line shown in FIG. 7(a).
Figure 7:
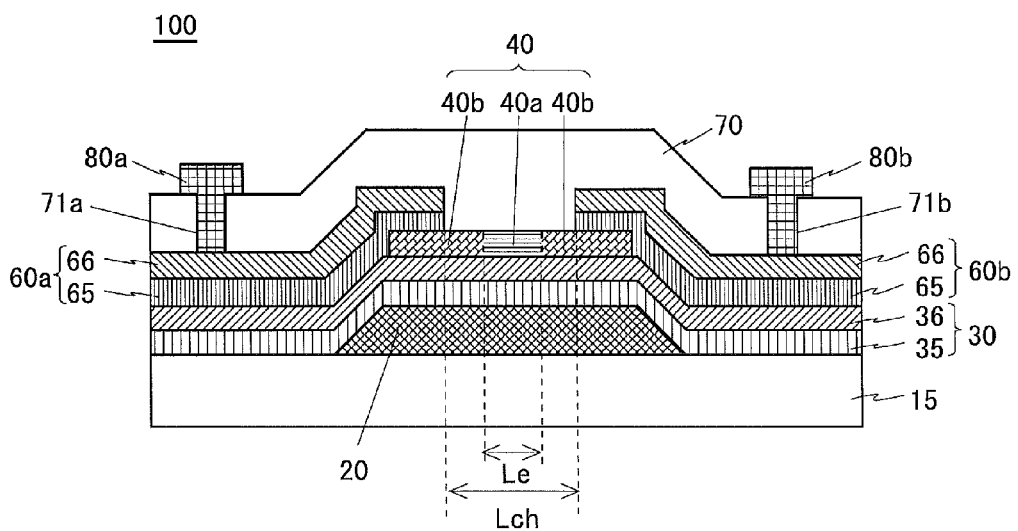

FIG. 7(a) is a plan view showing a configuration of a bottom-gate type TFT 100 according to a first embodiment of the present invention, and FIG. 7(b) is a cross-sectional view along the A-A line shown in FIG. 7(a). The TFT 100 shown in FIG. 7(a) and FIG. 7(b) are also referred to as a TFT of a channel etch structure. The configuration of the TFT 100 is described with reference to FIG. 7(a) and FIG. 7(b).

The gate electrode 20 is formed on the insulating substrate 15 such as a glass substrate. The gate electrode 20 is configured by a laminated metal film obtained by laminating a copper (Cu) film on a titanium film, for example. The gate electrode 20 may be configured by a laminated metal film obtained by laminating a titanium film, an aluminum (Al) film, and a titanium film in order from the insulating substrate 15 side.

The gate insulating film 30 is formed to cover the whole surface of the insulating substrate 15 including the gate electrode 20. The gate insulating film 30 is configured by a laminated insulating film obtained by laminating a silicon oxide ($SiO_2$) film 36 on a silicon nitride (SiNx) film 35. In this way, the silicon oxide film 36 is laminated on the silicon nitride film 35, to cause the gate insulating film 30 to not easily take oxygen away from an oxide semiconductor layer that becomes the channel layer 40 described later.

The channel layer 40 having an island shape is formed on the surface of the gate insulating film 30 at a position corresponding to the gate electrode 20. The channel layer 40 is made of an IGZO layer that contains indium (In), gallium (Ga), zinc (Zn), and oxygen (O). The low resistance regions 40b are formed at both sides of the channel layer 40. The high resistance region 40a having a higher resistance value than those in the low resistance regions 40b remains at the center of the channel layer 40 which is sandwiched between the two low resistance regions 40b.

The film thickness of the IGZO layer is preferably 30 nm to 50 nm. This is for the following reasons. When the film thickness of the IGZO layer becomes smaller than 30 nm, the TFT characteristic of the TFT 100 becomes unstable, and shift of the threshold voltage due to temperature and gate voltage stress occurs. On the other hand, when the film thickness becomes larger than 50 nm, controllability by the gate voltage becomes poor, and leak current (particularly, the leak current when the gate voltage is 0 V) increases.

The composition ratio of the IGZO layer that is used in the present embodiment may be the ratio shown in the following equation (4).

$$\text{Indium:gallium:zinc}=1:1:1 \quad (4)$$

However, the composition ratio of the IGZO layer may be as the ratio shown in the following equation (5), or may be other composition ratio.

$$\text{Indium:gallium:zinc}=4:5:1 \quad (5)$$

Although the IGZO layer used in the present embodiment is most preferably an amorphous film, the IGZO layer may be a crystalline film such as a microcrystalline film and a polycrystalline film. In the case of the microcrystalline film, the on-resistance of the TFT 100 becomes small, and the current driving force becomes large.

The oxide semiconductor that can be used as the channel layer 40 of the TFT 100 is not limited to IGZO, and may be an In—Zn—O system, an In—Zn—Sn—O system, or an In—Zn—Si—O system. Specifically, the oxide semiconductor may be IZO, ITO, ZnO, SnO, WO, and IO.

On the upper surface of the channel layer 40, a source electrode 60a and a drain electrode 60b that are separated with a predetermined distance are arranged. The source electrode 60a is formed to be extended from the left upper surface of the channel layer 40 onto the left-side gate insulating film 30. The drain electrode 60b is formed to be extended from the right upper surface of the channel layer 40 onto the right-side gate insulating film 30. The end parts of the source electrode 60a and the drain electrode 60b are respectively formed to be positioned on the left and right low resistance regions 40b.

The source electrode 60a and the drain electrode 60b are configured by a laminated metal film obtained by laminating copper electrodes 66 each having a film thickness of 300 nm to 1000 nm on the titanium electrodes 65 each having a film thickness of 100 nm, for example. In this way, the source electrode 60a and the drain electrode 60b are configured by the laminated metal film for the following reason. Because the resistance values of the titanium electrodes 65 are high, the resistance values of the source electrode 60a and the drain electrode 60b are lowered by laminating the copper electrodes 66 having low resistance values. The source electrode 60a and the drain electrode 60b include the titanium electrodes 65 for the following reason. Because titanium has high capacity to reduce the oxide semiconductor (particularly, IGZO) by taking oxygen away, the low resistance regions 40b can be easily formed. When the resistance values of the source electrode 60a and the drain electrode 60b may be high, the source electrode 60a and the drain electrode 60b may be configured by only the titanium electrodes 65.

The source electrode 60a and the drain electrode 60b may be the electrodes configured by a single-layer metal film of titanium, aluminum, copper, tungsten (W), molybdenum (Mo), tantalum (Ta), and the like, a single-layer alloy film of aluminum-neodymium (Nd), titanium-aluminum, molybdenum-tungsten, and indium-tin, and a laminated metal film such as a lamination of a titanium film, an aluminum film, and a titanium film in order, a lamination of an aluminum film on a titanium film, and a lamination of a molybdenum film on a titanium film.

The end part of the source electrode 60a is arranged above the left side part of the gate electrode 20, and the end part of the drain electrode 60b is arranged above the right side part of the gate electrode 20. Therefore, when a predetermined voltage is applied to the gate electrode 20, electrons are induced in the low resistance regions 40b of the channel layer 40 by the electric field from the gate electrode 20, so that high concentration carrier layers are formed. In accordance with the forming of the high concentration carrier layers, the source electrode 60a and the drain electrode 60b are brought into ohmic contact with the two low resistance regions 40b.

A passivation film 70 is formed to cover the whole surface of the insulating substrate 15 including the source electrode 60a and the drain electrode 60b. The passivation film 70 is made of a silicon oxide film having a film thickness of 300 nm. On the passivation film 70, contact holes 71a, 71b that reach the surfaces of the source electrode 60a and the drain electrode 60b are formed, respectively. The source electrode 60a and the drain electrode 60b are electrically connected respectively, via the contact holes 71a, 71b, to external wirings 80a, 80b that are formed on the passivation film 70.

In the TFT 100, the electrical channel length Le is shorter than the length Lch of the source/drain interval space. Preferably, as described later, the electrical channel length Le is shorter than the length Lch of the source/drain interval space by about 1 μm to 3 μm (inclusive). By setting the electrical channel length Le shorter than the length Lch of the source/drain interval space by 1 μm to 3 μm (inclusive), the TFT 100 operates normally even when the source/drain interval space is narrowed to the resolution limit. The electrical channel length Le shown in FIG. 7(a) and FIG. 7(b) expresses the channel length of the TFT 100 when a voltage of 20 V to 30 V is applied to the gate electrode 20.

2.2 Manufacturing Method of TFT

FIG. 8(a) to FIG. 8(c) and FIG. 9(a) to FIG. 9(c) are process cross-sectional views showing manufacturing processes of the TFT 100 shown in FIG. 7(a) and FIG. 7(b).

As shown in FIG. 8(a), on the insulating substrate 15, a titanium film (not shown) and a copper film (not shown) are formed continuously by using the sputtering method, for example. Next, on the surface of the copper film, a resist pattern (not shown) is formed by using the photolithography method. By using the resist pattern as a mask, the copper film and the titanium film are etched in this order by the wet etching method, so that the gate electrode 20 is formed. Therefore, the resist pattern 48 is peeled off. Accordingly, the gate electrode 20 that has the copper film layered on the titanium film is formed.

As shown in FIG. 8(b), to cover the whole surface of the insulating substrate 15 including the gate electrode 20, the gate insulating film 30 is formed by continuously forming the silicon nitride film 35 and the silicon oxide film 36, by using the plasma chemical vapor deposition method (hereinafter, referred to as "plasma CVD method").

As shown in FIG. 8(c), on the surface of the gate insulating film 30, an IGZO film 41 that contains indium, gallium, zinc, and oxygen is formed by using the sputtering method. The IGZO film 41 is formed by the DC (Direct Current) sputtering method, by using a target obtained by mixing indium oxide ($In_2O_3$), gallium oxide ($Ga_2O_3$), and zinc oxide (ZnO) in equal moles, and then by sintering the mixture. The film thickness of the IGZO film 41 is 30 nm to 50 nm.

Next, a resist pattern 48 is formed on the surface of the IGZO film 41. The IGZO film 41 is etched by the dry etching method by using the resist pattern 48 as a mask, and the resist pattern 48 is peeled off. Accordingly, the IGZO layer that becomes the channel layer 40 having an island shape is formed on the gate insulating film 30 at a position corresponding to the gate electrode 20.

Next, heat treatment is performed for one hour at a temperature of 350° C. in the atmosphere. By performing the heat treatment, the film quality of the gate insulating film 30 such as the silicon oxide film 36 is improved, and the shift amount of the threshold voltage due to the temperature stress and the gate voltage stress can be suppressed. Further, because the defect at the interface between the silicon oxide film 36 and the channel layer 40 decreases, the rising characteristic of the TFT 100 can be improved. In this way, in the case of performing the heat treatment before forming the source electrode 60a and the drain electrode 60b, the reduction of the IGZO layer by the titanium electrodes 65 does not need to be considered. Therefore, the heat treatment at a high temperature which is aimed at only the improvement of the TFT characteristic becomes possible.

Figure 9:
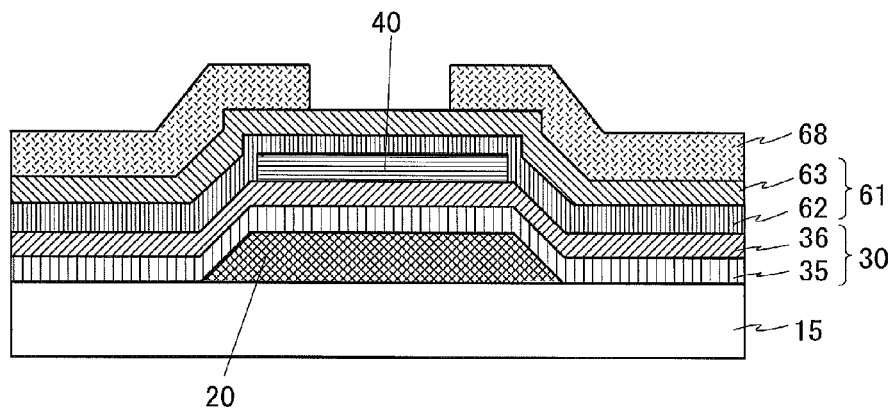
FIGS. 9(a) to 9(c) are process cross-sectional views showing the manufacturing processes of the TFT shown in FIG. 7(a) and FIG. 7(b).
Figure 9:
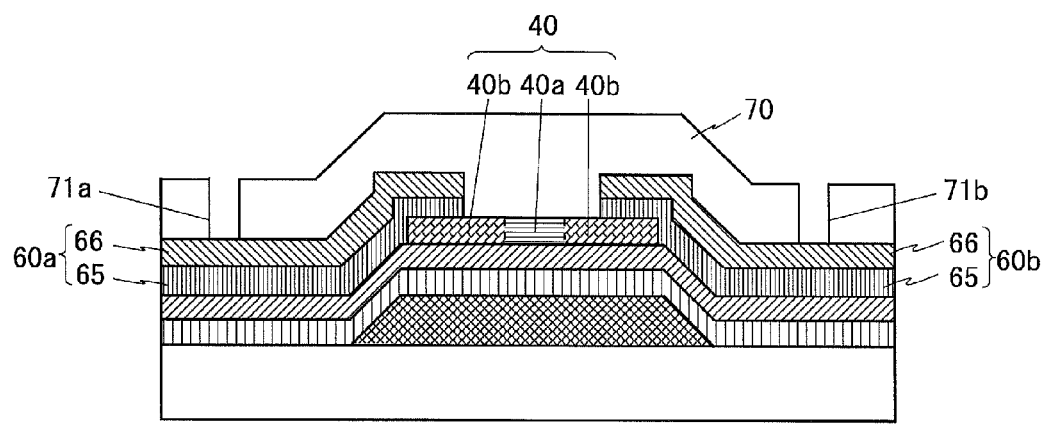
Figure 9:
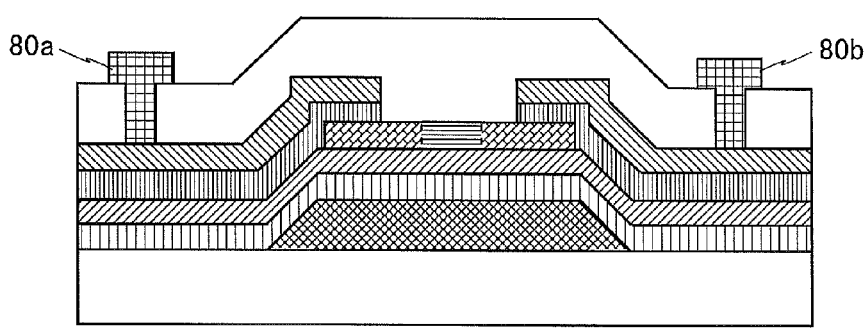

As shown in FIG. 9(a), a source metal film 61 is formed by using the sputtering method. The source metal film 61 is configured by the laminated metal film obtained by laminating a copper film 63 having a film thickness of 300 nm to 1000 nm on a titanium film 62 having a film thickness of 30 nm to 100 nm. In this case, it is found that the film thickness of the titanium film 62 and the power at the sputtering time are deeply related to the electrical channel length Le, together with heat treatment conditions described later. These conditions are described later.

Next, on the source metal film 61, resist patterns 68 separated to the left and right with a predetermined distance are formed above the gate electrode 20, by using the photolithography method. Because the predetermined distance formed in the resist patterns 68 is shorter than the length of the gate electrode 20, the end parts of the resist patterns 68 are respectively formed to be overlapped with the left and right side parts of the gate electrode 20.

As shown in FIG. 9(b), by using the resist patterns 68 as masks, the copper film 63 and the titanium film 62 of the source metal film 61 are etched in order by the wet etching method, so that the source electrode 60a and the drain electrode 60b that are laminated with the titanium electrodes 65 and the copper electrodes 66 are formed. Accordingly, the source electrode 60a is extended from the left upper surface of the channel layer 40 onto the left-side gate insulating film 30. The drain electrode 60b is extended from the right upper surface of the channel layer 40 onto the right-side gate insulating film 30. An etching stopper layer is not formed on the channel layer 40. However, because the source metal film 61 is etched by the wet etching method, the channel layer 40 is little reduced at the time of forming the source electrode 60a and the drain electrode 60b.

To cover the whole surface of the insulating substrate 15 including the source electrode 60a and the drain electrode 60b, a silicon oxide film that becomes the passivation film 70 is formed by using the plasma CVD method. Because the passivation film 70 is in direct contact with the channel layer 40, the silicon oxide film that does not easily reduce the IGZO layer which constitutes the channel layer 40 is preferably used for the passivation film 70.

The contact holes 71a, 71b that reach respectively the surfaces of the source electrode 60a and the drain electrode 60b are formed in the passivation film 70 by using the dry etching method. Next, heat treatment is performed for one hour at a temperature of 300° C. in the atmosphere. By the heat treatment, oxygen moves to the titanium electrodes 65 from the IGZO layer constituting the channel layer 40. Accordingly, the low resistance regions 40b are formed at both sides of the channel layer 40. At the center of the channel layer 40 sandwiched between the two low resistance regions 40b, the high resistance region 40a having a higher resistance value than those of the low resistance regions 40b remains. By this heat treatment, the electrical channel length Le of the TFT 100 is determined.

Further, by this heat treatment, the source electrode 60a and the drain electrode 60b can be recovered from damages that are generated at the time of etching the contact holes 71a, 71b. Further, because oxygen that is contained in the passivation film 70 is supplied to the high resistance region 40a of the channel layer 40, the high resistance region 40a can maintain a high resistance value. Because the temperature and the time of the heat treatment are determined by taking into account the film thickness of the titanium film 62 and the power at the film-forming time, their details are described later.

As shown in FIG. 9(c), a metal film (not shown) is formed on the passivation film 70 including the contact holes 71a, 71b, and the metal film is patterned by using a resist pattern (not shown) as a mask. Accordingly, the external wirings 80a, 80b that are electrically connected to the source electrode 60a and the drain electrode 60b are formed respectively via the contact holes 71a, 71b.

In the above description, the heat treatment is performed before forming the source metal film 61 and after forming the contact holes 71a, 71b. However, by omitting the heat treatment before forming the source metal film 61, the heat treatment may be collectively performed after forming the contact holes 71a, 71b. In the case of performing the heat treatment after forming the contact holes 71a, 71b, the reduction of the IGZO layer by the titanium electrodes 65 progresses, and therefore, the heat treatment cannot be performed at a high temperature for a long time. Accordingly, it is difficult to sufficiently improve the TFT characteristic. However, because the number of times of performing the heat treatment can be decreased by one, the manufacturing process of the TFT 100 can be simplified.

2.3 Electrical Channel Length and Processing Conditions

It is found that the length ΔL of the low resistance regions 40b that is determined by the reduction of the IGZO film 41 by the titanium film 62 is greatly influenced by the film thickness of the titanium film 62, the power at the time of forming the titanium film 62 by sputtering, and the heat treatment conditions (temperature and time) after forming the titanium film 62 (after forming the contact holes 71a, 71b, for example). Experiments for checking the relationship between these processing conditions and the length ΔL of the low resistance regions 40b were performed. FIG. 10 is a view showing the relationship between various processing conditions and the length ΔL of the low resistance regions 40b. The length Lch of the source/drain interval space of the TFT used in the experiments is 5 μm.

The processing conditions used in the experiments are described. The film thickness of the titanium film 62 was set to 30 nm or 70 nm, and the power at the film-forming time by the sputtering method was 2 kW or 7 kW. Heat treatment was performed after forming the titanium film 62 by changing the temperature within the range of 250° C. to 350° C. in the atmosphere, and the processing time was one hour for all cases. The experiments were performed by combining these processing conditions.

In the experiment 1, heat treatment was performed for one hour by setting the film thickness of the titanium film 62 to 100 nm, setting the power to 2 kW, and at 350° C. At this time, the length ΔL of the low resistance regions 40b was 0 μm. Therefore, because the electrical channel length Le of a TFT 101 was 5 μm which is the same as the length Lch of the source/drain interval space, it was not possible to shorten the electrical channel length Le.

Figure 11:
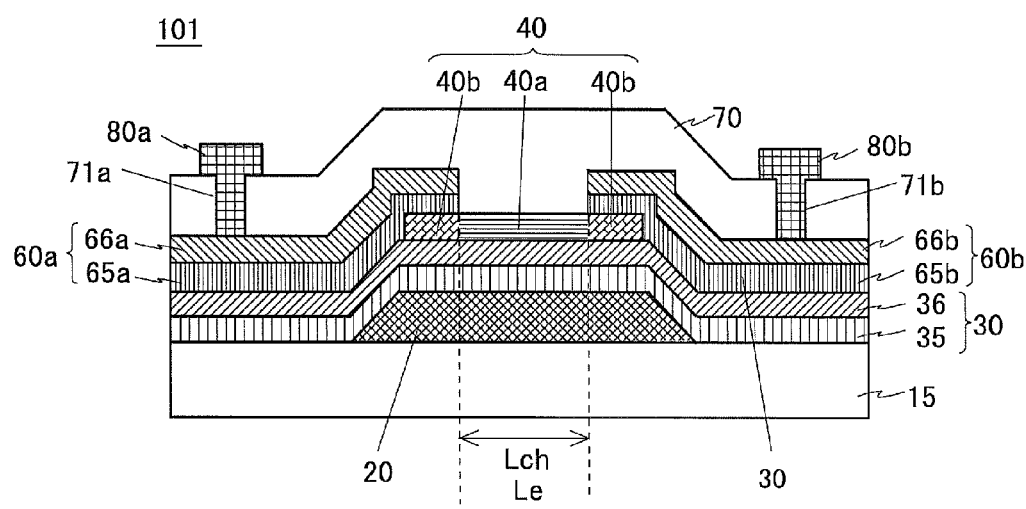
FIG. 11 is a cross-sectional view of the TFT manufactured in the processing conditions of the experiment 1 shown in FIG. 10.

FIG. 11 is a cross-sectional view of the TFT 101 manufactured in the processing conditions of the experiment 1. In FIG. 11, constituent elements that are the same as the constituent elements of the TFT 100 shown in FIG. 7(b) are attached with the same reference marks, and their descriptions are omitted. As shown in FIG. 11, in the channel layer 40 of the TFT 101, the length ΔL of the low resistance regions 40b is 0 μm, and the length Lch of the source/drain interval space matches the electrical channel length Le. Therefore, the electrical channel length Le is determined by the resolution limit of the exposure device, and cannot be set smaller.

In the experiment 2, heat treatment was performed for one hour by setting the film thickness of the titanium film 62 to 30 nm, setting the power to 7 kW, and at 350° C. At this time, the length ΔL of the low resistance regions 40b is 5 μm. In this case, the electrical channel length Le of the TFT became 0 μm, and a TFT 102 always became in the conductive state.

Figure 12:
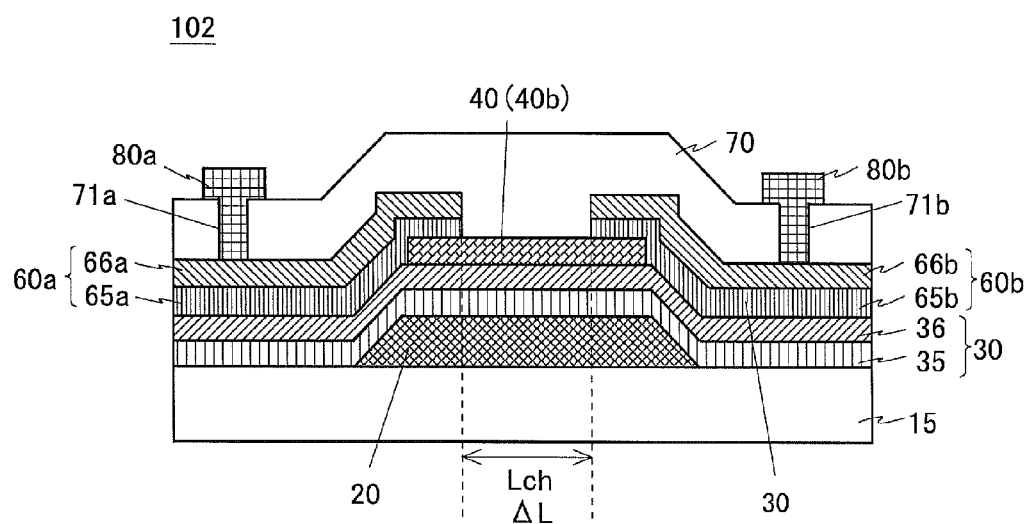
FIG. 12 is a cross-sectional view of the TFT manufactured in the processing conditions of the experiment 2 shown in FIG. 10.

FIG. 12 is a cross-sectional view of the TFT 102 manufactured in the processing conditions of the experiment 2. In FIG. 12, constituent elements that are the same as the constituent elements of the TFT 100 shown in FIG. 7(b) are attached with the same reference marks, and their descriptions are omitted. As shown in FIG. 12, in the channel layer 40 of the TFT 102, the high resistance region is extinguished, and the whole becomes the low resistance region 40b. Therefore, the TFT 102 always becomes in the conductive state, and loses the function of the transistor.

In the experiment 3, heat treatment was performed for one hour by setting the film thickness of the titanium film 62 to 30 nm, and at 300° C. At this time, the length ΔL of the low resistance regions 40b was 3 μm. In this case, it was found that the electrical channel length Le of the TFT became 2 μm and the TFT operated normally.

In the experiment 4, heat treatment is performed for one hour by setting the film thickness of the titanium film 62 to 70 nm, setting the power to 7 kW, and at 300° C. At this time, the length ΔL of the low resistance regions 40b is 2 μm. In this case, it was found that the electrical channel length Le of the TFT became 3 μm and the TFT operated normally. From the results of the experiment 3 and the experiment 4, it was found that when the film thickness of the titanium film 62 is set large, the length ΔL of the low resistance regions 40b becomes short, and the electrical channel length Le becomes long.

In the experiment 5, heat treatment was performed for one hour by setting the film thickness of the titanium film 62 to 70 nm, setting the power to 7 kW, and at 250° C. At this time, the length ΔL of the low resistance regions 40b was 1 μm. In this case, it was found that the electrical channel length Le of the TFT became 4 μm and the TFT operated normally. From the results of the experiment 4 and the experiment 5, it was found that when the heat treatment temperature is set low, the length ΔL of the low resistance regions 40b becomes short, and the electrical channel length Le becomes long.

From the results of the experiment 3 to the experiment 5, it is found that when the length ΔL of the low resistance regions 40b is 1 μm to 3 μm (inclusive), the TFT operates normally. From this fact, the electrical channel length Le is preferably shorter than the length Lch of the source/drain interval space by about 1 μm to 3 μm (inclusive).

It is found that when the power at the time of forming the titanium film 62 is smaller, the length ΔL of the low resistance regions 40b becomes short and the electrical channel length Le becomes long. In this way, the length ΔL of the low resistance regions 40b is determined by mainly the film thickness of the titanium film 62 and the power at the film-forming time. When the film thickness of the titanium film 62 is large and also when the power at the film-forming time is small, the length ΔL of the low resistance regions 40b becomes the shortest and the electrical channel length Le becomes the longest. In this way, by adjusting the film thickness of the titanium film 62 and the power, the length of the high resistance region 40a can be set shorter than the resolution limit of the exposure device. Therefore, a thin film transistor having large current driving force can be formed.

In the experiments 1 to 5, the heat treatment time was set one hour, but can be set for 0.5 hour to 3 hours (inclusive). When the heat treatment is performed in the time shorter than 0.5 hour, the variation of the length ΔL of the low resistance regions 40b can be suppressed, and therefore, the variation of the electrical channel length Le can be also suppressed. However, the shift of the threshold voltage due to the gate voltage stress cannot be sufficiently suppressed. On the other hand, when the heat treatment is performed in the time longer than 3 hours, the throughput becomes poor. When the heat treatment is performed at a temperature lower than 250° C., the shift of the threshold voltage cannot be suppressed, and the low resistance regions 40b cannot be easily formed. On the other hand, when the heat treatment is performed at a temperature higher than 350° C., the variation of the length ΔL of the low resistance regions 40b becomes large, and therefore, the variation of the electrical channel length Le becomes large.

The experiment 6 is an experiment result of a TFT 200 according to a second embodiment described later, and therefore, this is described in the second embodiment.

2.4 Gate Voltage-Drain Current Characteristic

Figure 13:
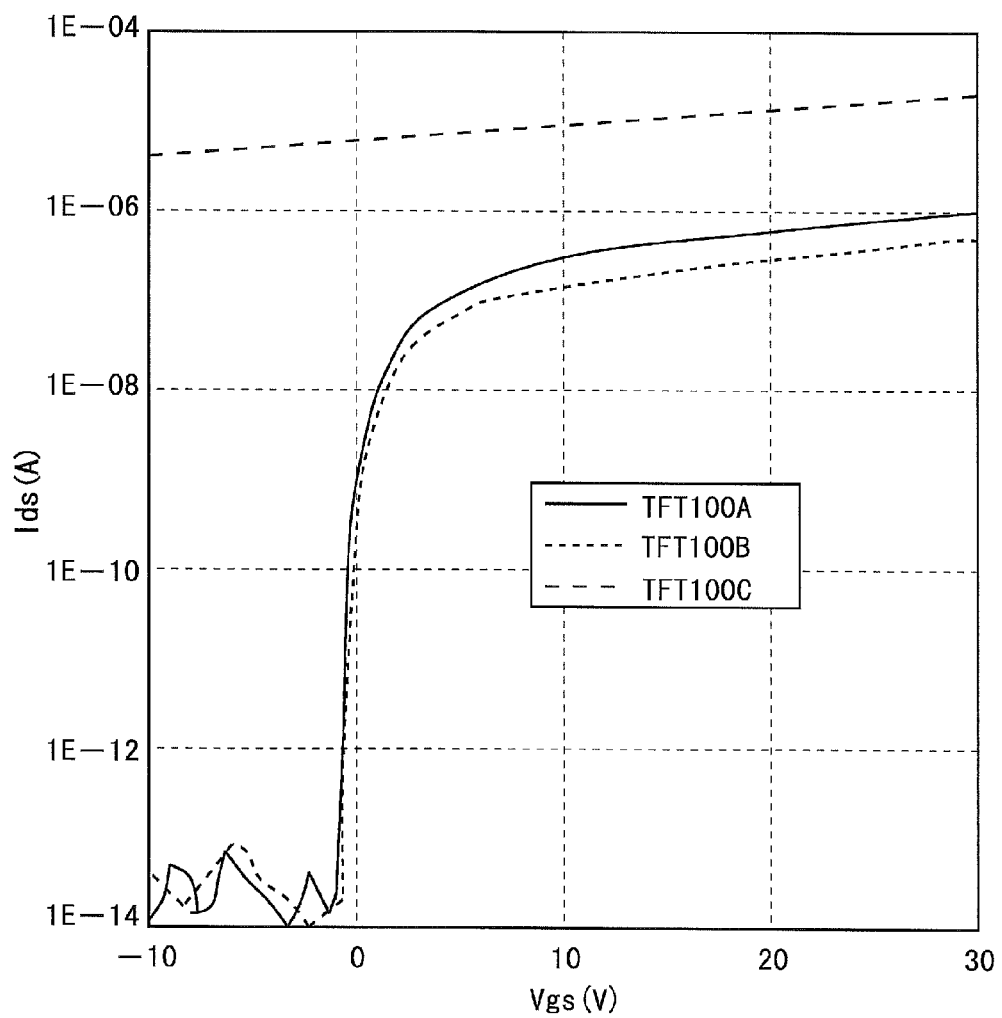
FIG. 13 is a graph showing a gate voltage-drain current characteristic of the TFT shown in FIG. 7(a) and FIG. 7(b).

FIG. 13 is a graph showing a gate voltage-drain current characteristic of the TFT 100 shown in FIG. 7(a) and FIG.

7(b). In FIG. 13, a TFT 110A is the TFT in which the length ΔL of the low resistance regions 40b is 2 μm, a TFT 110B is the TFT in which the length ΔL of the low resistance regions 40b is 0 μm, and a TFT 110C is the TFT in which the length ΔL of the low resistance regions 40b is 4.5 μm. The length Lch of the source/drain interval space in each of the TFT 100A to TFT 100C is 4.5 μm.

In the TFT 100A, heat treatment was performed for one hour at 300° C. In this case, because the length ΔL of the low resistance regions 40b is 2 μm, the electrical channel length Le is 2.5 μm. In the TFT 100B, the film thickness of each titanium electrode 65 directly in contact with the IGZO layer constituting the channel layer 40 was 100 nm, and heat treatment was performed for one hour at 250° C. In this case, because the length ΔL of the low resistance regions 40b is 0 μm, the electrical channel length Le remains 4.5 μm. In the TFT 100C, because the length ΔL of the low resistance regions 40b is the same as the length of the source/drain interval space, the electrical channel length Le remains 0 μm.

As is clear from FIG. 13, drain current Ids of the TFT 100A is 1.8 times as large as the drain current Ids of the TFT 100B. This is considered because the electrical channel length Le of the TFT 100A is shorter than the electrical channel length Le of the TFT 100B by 2.0 μm. From this fact, it is understood that by adjusting the electrical channel length Le by controlling the length ΔL of the low resistance regions 40b, the TFT 100A having excellent current driving force can be manufactured. In the TFT 100C, it is shown that because the electrical channel length Le becomes 0 μm, the drain current Ids cannot be controlled by the gate voltage.

3. Second Embodiment

3.1 Configuration of TFT

Figure 14:
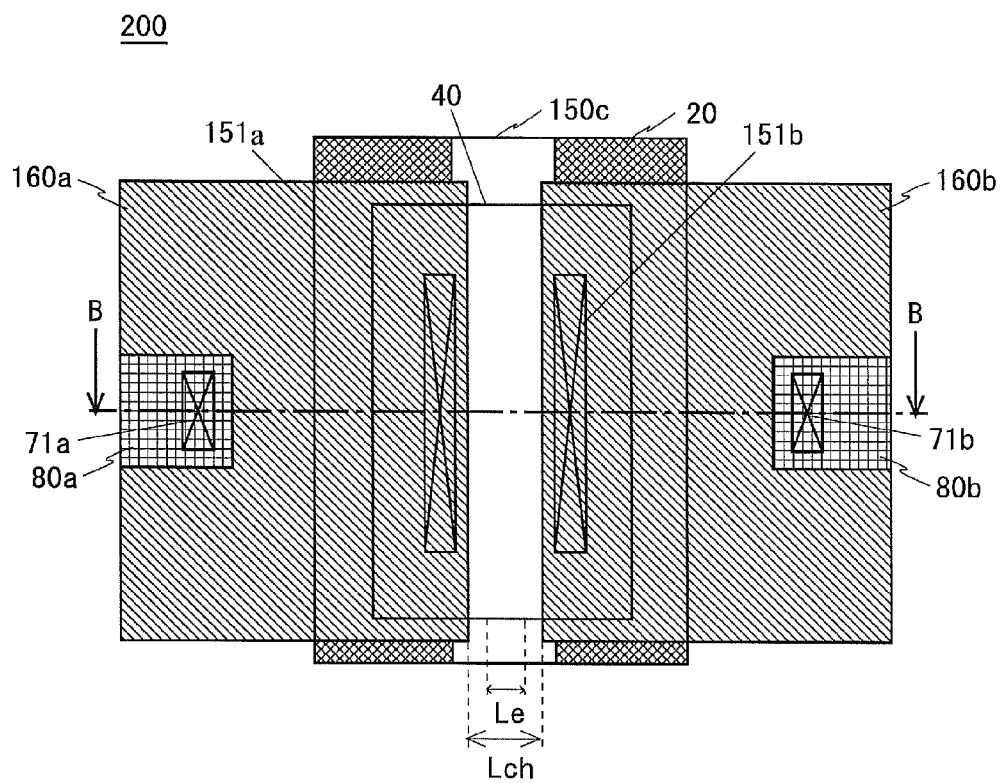
FIG. 14(a) is a plan view showing a configuration of a bottom-gate type TFT according to a second embodiment of the present invention.
FIG. 14(b) is a cross-sectional view along the B-B line of the TFT shown in FIG. 14(a).
Figure 14:
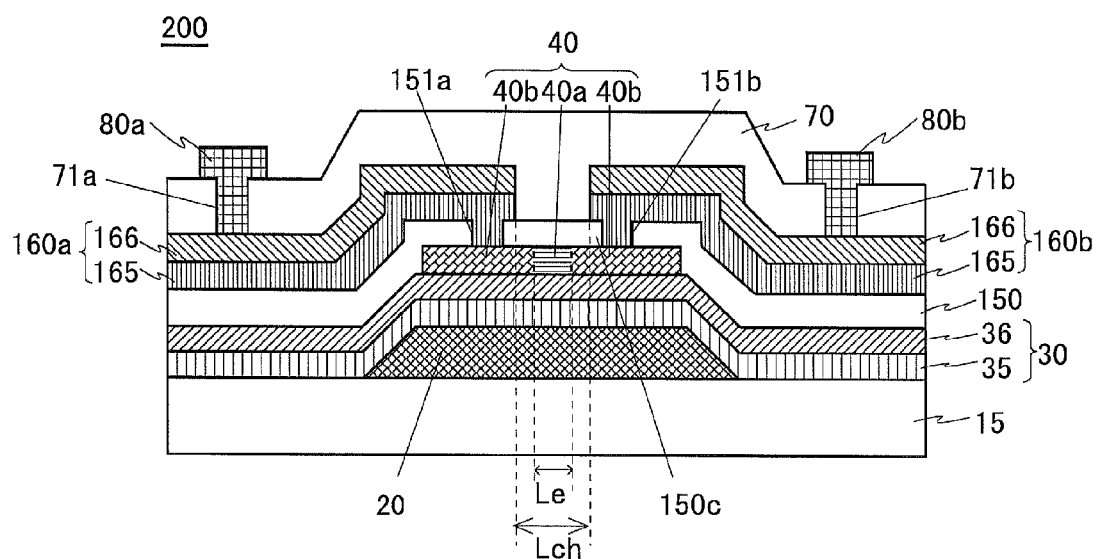

FIG. 14(a) is a plan view showing a configuration of a bottom-gate type TFT 200 according to the second embodiment of the present invention, and FIG. 14(b) is a cross-sectional view along the B-B line of the TFT 200 shown in FIG. 14(a). The TFT 200 shown in FIG. 14(a) and FIG. 14(b) is also referred to as a TFT of an etch stopper structure.

The configuration of the TFT 200 is described with reference to FIG. 14(a) and FIG. 14(b). On the insulating substrate 15 such as a glass substrate, the gate electrode 20 is formed. To cover the whole surface of the insulating substrate 15 including the gate electrode 20, the gate insulating film 30 is formed. Because the configurations of the gate electrode 20 and the gate insulating film 30 are the same as those of the TFT 100 according to the first embodiment, the same reference marks are attached and their descriptions are omitted.

On the surface of the gate insulating film 30 at a position corresponding to the gate electrode 20, the channel layer 40 having an island shape is formed. The channel layer 40 is made of an IGZO layer. The channel layer 40 includes the low resistance regions 40b formed at both sides of the channel layer 40, and the high resistance region 40a that is left at the center of the channel layer 40 sandwiched between the two low resistance regions 40b. The film thickness of the IGZO layer, crystallinity, and composition ratios are the same as those of the TFT 100 according to the first embodiment, and therefore, their descriptions are omitted.

Unlike in the TFT 100, an etching stopper layer 150 is formed on the channel layer 40 and the gate insulating film 30. The etching stopper layer 150 has a function of protecting the surface of the channel layer 40 from being etched, and reducing the load capacity of the wiring, at the time of forming by etching a source electrode 160a and a drain electrode 160b described later. Therefore, although the film thickness of the etching stopper layer 150 is preferably large, there arises a problem that when the film thickness is too large, the film-forming time becomes long, so that the throughput drops. Accordingly, the preferable film thickness of the etching stopper layer 150 is 100 nm to 500 nm. The etching stopper layer 150 is formed by the silicon oxide film to cause oxygen to be not easily taken away from the IGZO layer constituting the channel layer 40 which comes in direct contact with the etching stopper layer 150.

On the etching stopper layer 150, contact holes 151a, 151b that reach the low resistance regions 40b of the channel layer 40 are formed, respectively. In the etching stopper layer 150, on the upper surface of an etching stopper layer 150c that is sandwiched between the contact holes 151a, 151b, the source electrode 160a and the drain electrode 160b that are formed with a predetermined distance are arranged. The source electrode 160a is formed to be extended from the left upper surface of the etching stopper layer 150c to above the left-side gate insulating film 30, and is also electrically connected to the low resistance region 40b of the channel layer 40 via the contact hole 151a. The drain electrode 160b is formed to be extended from the right upper surface of the etching stopper layer 150c to above the right-side gate insulating film 30, and is also electrically connected to the low resistance region 40b of the channel layer 40 via the contact hole 151b. The film thicknesses and the materials of the source electrode 160a and the drain electrode 160b are the same as those in the TFT 100, and therefore, their descriptions are omitted.

The end part of the source electrode 160a is arranged on the left upper surface of the etching stopper layer 150c, and the end part of the drain electrode 160b is arranged on the right upper surface of the etching stopper layer 150c. Therefore, like in the TFT 100, when the gate voltage is applied to the gate electrode 20, electros are induced in the low resistance regions 40b, so that the high concentration carrier layers are formed. Accordingly, in accordance with the forming of the high concentration carrier layers, the source electrode 160a and the drain electrode 160b are respectively brought into ohmic contact with the two low resistance regions 40b.

A passivation film 70 is formed to cover the whole surface of the insulating substrate 15 including the source electrode 160 and the drain electrode 160b. The passivation film 70 is made of a silicon oxide film having a film thickness of 300 nm. On the passivation film 70, contact holes 71a, 71b that reach the surfaces of the source electrode 160a and the drain electrode 160b are formed, respectively. The source electrode 160a and the drain electrode 160b are electrically connected respectively, via the contact holes 71a, 71b, to external wirings 80a, 80b that are formed on the passivation film 70.

In the TFT 200, the electrical channel length Le is shorter than the length Lch of the source/drain interval space. The electrical channel length Le is preferably shorter than the length Lch of the source/drain interval space by about 1 μm to 3 μm (inclusive), like in the TFT 100. By setting the electrical channel length Le shorter than the length Lch of the source/drain interval space by 1 μm to 3 μm (inclusive), the TFT 200 operates normally even when the source/drain interval space is narrowed to the resolution limit. The electrical channel length Le shown in FIG. 14(a) and FIG. 14(b) expresses the channel length of the TFT 200 when a voltage of 20 V to 30 V is applied to the gate electrode 20.

3.2 Manufacturing Method of TFT

FIG. 15(a) to FIG. 15(d) and FIG. 16(a) to FIG. 16(c) are process cross-sectional views showing manufacturing processes of the TFT 200 shown in FIG. 14(a) and FIG. 14(b).

Figure 15:
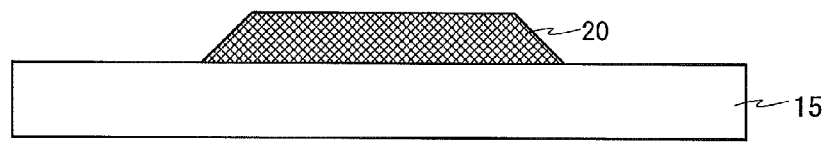
FIGS. 15(a) to 15(d) are process cross-sectional views showing the manufacturing processes of the TFT shown in FIG. 14(a) and FIG. 14(b).
Figure 15:
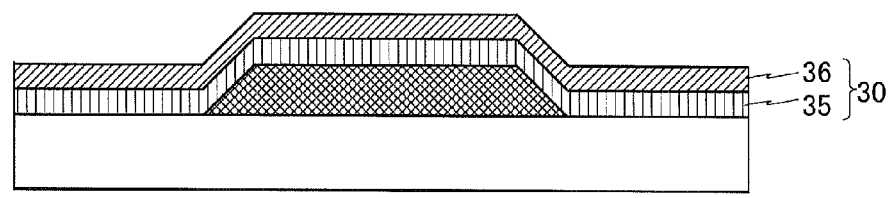
Figure 15:
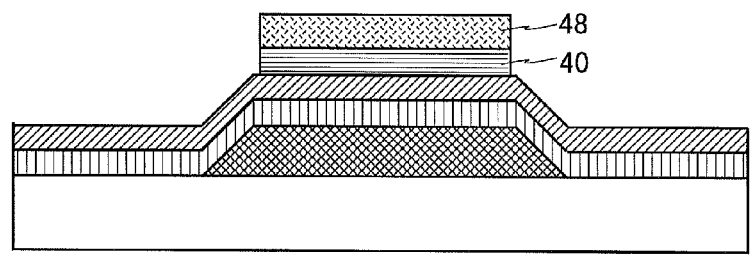
Figure 15:
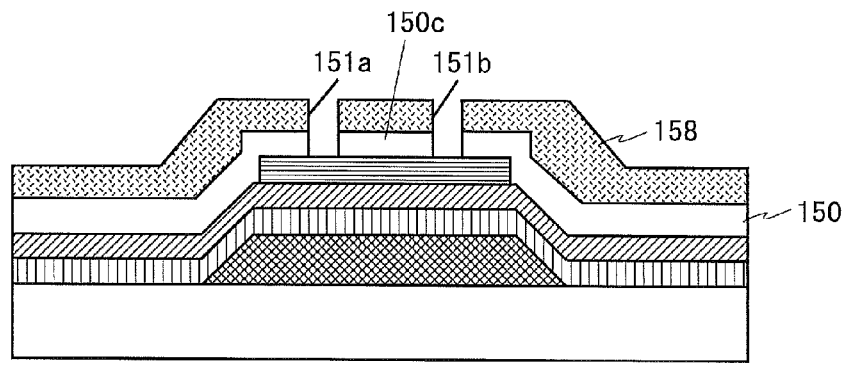

Out of the manufacturing processes of the TFT 200, the processes of forming the gate electrode 20, the gate insulating film 30, and the channel layer 40 in order on the insulating substrate 15 shown in FIG. 15(a) to FIG. 15(c) are the same as the processes shown in FIG. 8(a) to FIG. 8(c). Therefore, FIG. 15(a) to FIG. 15(c) are attached with the same reference marks as those in FIG. 8(a) to FIG. 8(c), and their descriptions are omitted.

As shown in FIG. 15(d), by using the plasma CVD method, a silicon oxide film 151 having a film thickness of 100 nm to 500 nm is formed by covering the channel layer 40. A resist pattern 158 is formed on the silicon oxide film 151. By using the resist pattern 158 as a mask, the silicon oxide film 151 is etched by the dry etching method, so that the etching stopper layer 150 formed with the contact holes 151a, 151b that respectively reach the surface of the channel layer 40 is formed. In the etching stopper layer 150, the portion sandwiched between the contact holes 151a, 151b is referred to as the etching stopper layer 150c.

Next, heat treatment is performed for one hour at 350° C. This heat treatment has the object of improving reliability such as suppression of the shift of the threshold voltage due to the gate voltage stress, and improving the TFT characteristic by recovering the IGZO layer from damages generated at the contact etching time. This heat treatment is performed after forming the contact holes 151a, 151b and before forming a source metal film 161 described later.

Figure 16:
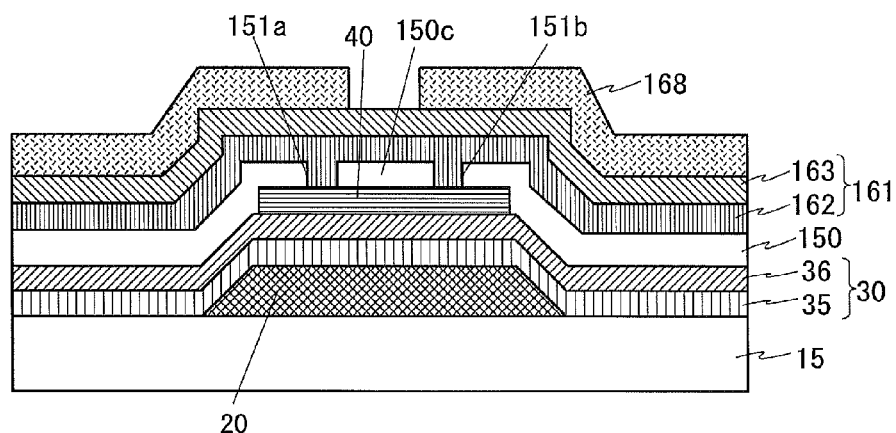
FIGS. 16(a) to 16(c) are process cross-sectional views showing the manufacturing processes of the TFT shown in FIG. 14(a) and FIG. 14(b).
Figure 16:
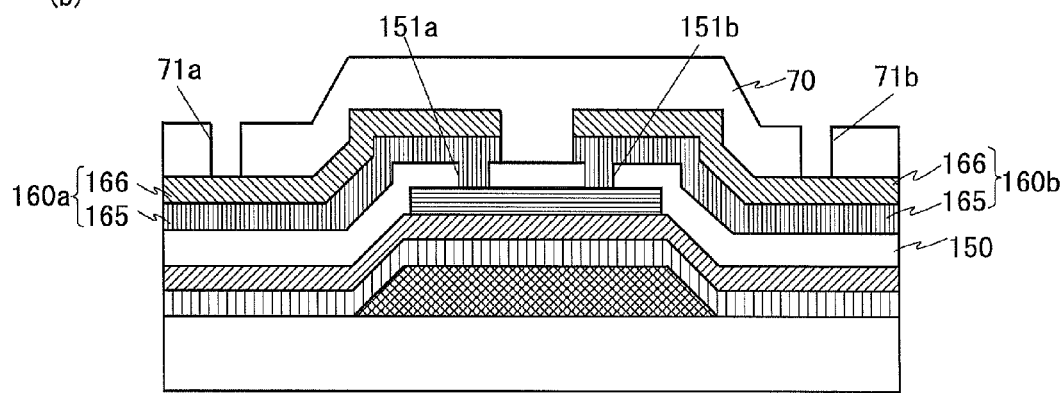
Figure 16:
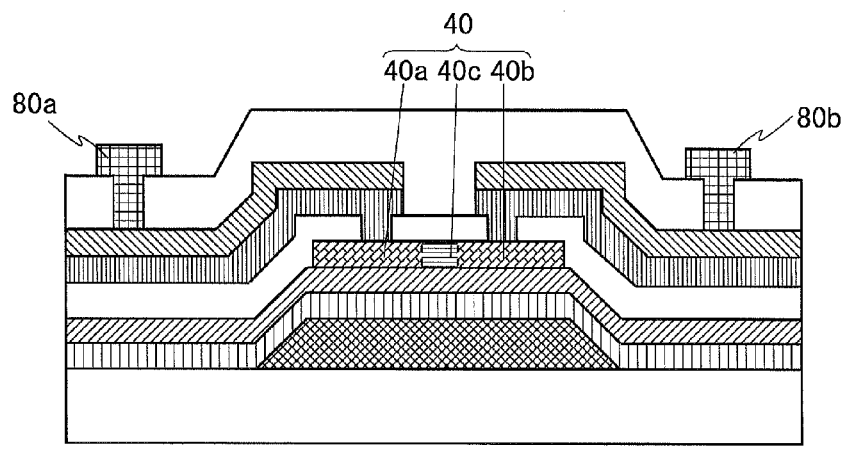

As shown in FIG. 16(a), by using the sputtering method, the source metal film 161 is formed on the etching stopper layer 150 including the contact holes 151a, 151b. A configuration, a film thickness, and film forming conditions of the source metal film 161 are the same as those of the source metal film 61 of the TFT 100, and therefore, their descriptions are omitted.

Next, on the source metal film 161, by using the photolithography method, a resist pattern 168 that is separated to the left and right with a predetermined distance above the etching stopper layer 150 is formed.

As shown in FIG. 16(b), by using the resist pattern 168 as a mask, and by using the dry etching method, a copper film 162 and a titanium film 163 that are included in the source metal film 161 are etched in order, so that the source electrode 160a and the drain electrode 160b that are configured by titanium electrodes 165 and copper electrodes 166 are formed. Accordingly, the source electrode 160a is extended from the left upper source of the etching stopper layer 150c to above the left-side gate insulating film 30, and is also electrically connected to the channel layer 40 via the contact hole 151a. The drain electrode 160b is extended from the right upper source of the etching stopper layer 150c to above the right-side gate insulating film 30, and is also electrically connected to the channel layer 40 via the contact hole 151b. Positional relationships between the source electrode 160a and the gate electrode 20 and between the drain electrode 160b and the gate electrode 20 are the same as those in the TFT 100, and therefore, their descriptions are omitted.

The forming of the passivation film 70 to the forming of the external wirings 80a, 80b shown in FIG. 16(c) are the same as those in the TFT 100, except the heat treatment after forming the contact holes 71a, 71b. Therefore, their descriptions are omitted. By the heat treatment after forming the contact holes 71a, 71b, the low resistance regions 40b are formed at both sides of the channel layer 40, and the high resistance region 40a remains at the center of the channel layer 40 that is sandwiched between the two low resistance regions 40b. In this way, the TFT 200 shown in FIG. 14(a) and FIG. 14(b) is formed.

3.3 Heat Treatment Conditions after Forming Contact Holes

Figure 17:
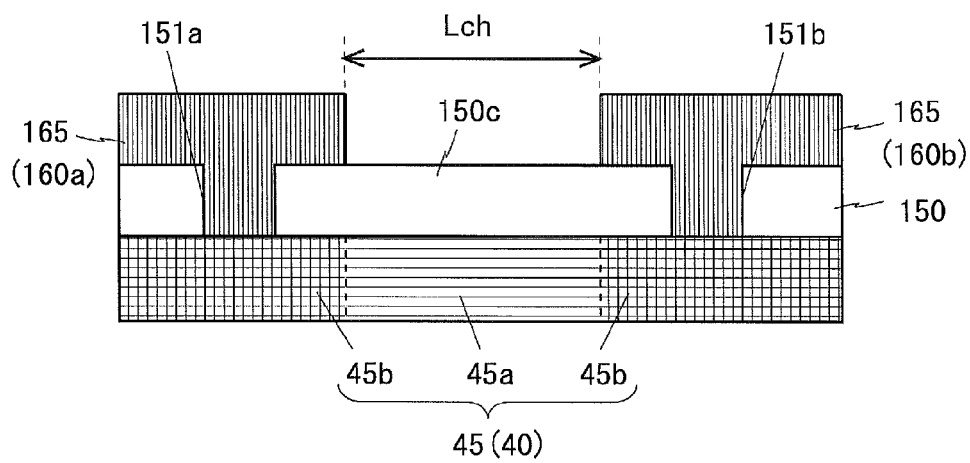
FIGS. 17(a) and 17(b) are enlarged cross-sectional views near the channel layer of the TFT shown in FIG. 14(a) and FIG. 14(b).
Figure 17:
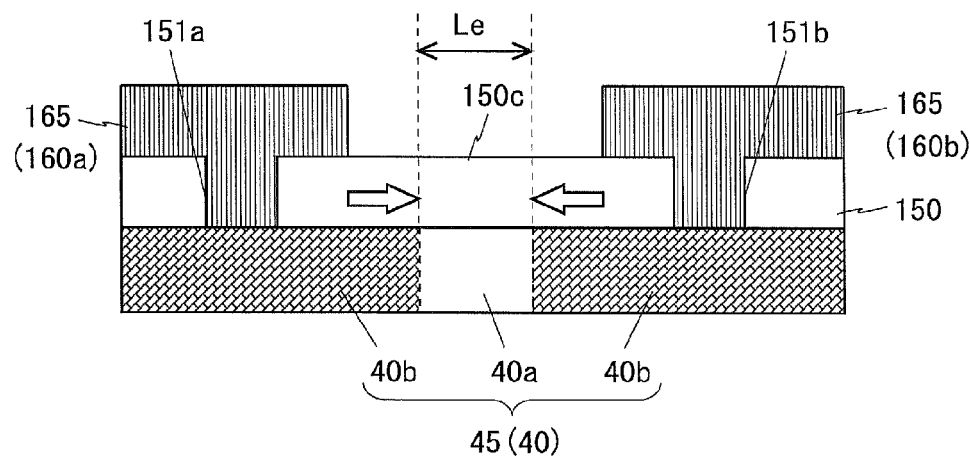

Although the temperature of the heat treatment after forming the contact holes is 300° C. in the first embodiment, a high temperature of 350° C. is set in the present embodiment. The reason is described. FIG. 17(a) and FIG. 17(b) are enlarged cross-sectional views near the channel layer 40 of the TFT 200.

As shown in FIG. 17(a), titanium electrodes 165 that are included in the source electrode 160a and the drain electrode 160b are formed on the etching stopper layer 150. The titanium electrodes 165 are electrically connected to the IGZO layer 45 constituting the channel layer 40 via the contact holes 151a, 151b that are formed in the etching stopper layer 150. When a voltage is applied to the titanium electrodes 165, electrons are induced in the IGZO layer 45 at positions corresponding to the titanium electrodes 165, by the electric field of the voltage. As a result, high concentration carrier layers are formed in the IGZO layer 45 at positions corresponding to the titanium electrodes 165 on the etching stopper layer 150.

To shorten the electrical channel length Le of the channel layer 40 in which the high concentration carrier layers are formed, the IGZO layer 45 beneath the etching stopper layer 150c needs to be more reduced. However, the IGZO layer 45 beneath the etching stopper layer 150c is at a position separated from the positions of the contact holes 151a, 151b. Therefore, as shown in FIG. 17(b), by increasing the temperature of the heat treatment, oxygen that is included in IGZO layers 45b in the source/drain interval space needs to be taken away by moving the oxygen to the titanium electrodes 165. The IGZO layers 45b from which oxygen has been taken away in this way become the low resistance regions 40b. Because oxygen is not taken away from an IGZO layer 45a that is sandwiched between the two low resistance regions 40b, the IGZO layer 45a remains as the high resistance region 40a. Accordingly, the electrical channel length Le becomes shorter than the length Lch of the source/drain interval space.

When the length of the etching stopper layer 150c is 7.5 μm, for example, from the result of the experiment 6 shown in FIG. 10, the length ΔL of the low resistance regions 40b when a voltage of 20 V to 30 V is applied to the gate electrode 20 becomes 5 μm. Therefore, the electrical channel length Le becomes 2.5 μm. From this fact, it is found that when the gate voltage is applied to the TFT 200, the low resistance regions 40b having the length 2.5 μm are formed respectively in the IGZO layer 45 at positions beneath both ends of the etching stopper layer 150c. As a result, as compared with the experiment 1 shown in FIG. 10, the electrical channel length Le can be shortened by 2 μm.

3.4 Effects

According to the present embodiment, the current driving force can be set high in a similar manner to that of the TFT 100 according to the first embodiment.

4. Third Embodiment

4.1 Configuration of TFT

FIG. 18(a) is a plan view showing a configuration of a bottom-gate type TFT 300 according to a third embodiment of the present invention, and FIG. 18(b) is a cross-sectional view along the C-C line of the TFT 300 shown in FIG. 18(a). The TFT 300 shown in FIG. 18(a) and FIG. 18(b) is also referred to as a TFT of a bottom contact structure.

The configuration of the TFT 300 is described with reference to FIG. 18(*a*) and FIG. 18(*b*). On the insulating substrate 15, the gate electrode 20 is formed. To cover the whole surface of the insulating substrate 15 including the gate electrode 20, the gate insulating film 30 is formed. Because the configurations of the gate electrode 20 and the gate insulating film 30 are the same as those in the TFT 100 according to the first embodiment, the same reference marks are attached, and their descriptions are omitted.

On the gate insulating film 30 above the gate electrode 20, a source electrode 260*a* and a drain electrode 260*b* that are formed with a predetermined distance are formed. The source electrode 260*a* and the drain electrode 260*b* are configured by titanium electrodes 265, copper electrodes 266, and titanium electrodes 267 that are laminated in order on the surface of the gate insulating film 30. In the source electrode 260*a*, the end parts of the copper electrode 266 and the titanium electrode 267 are receded to the left side from the end part of the titanium electrode 265. In the drain electrode 260*b*, the end parts of the copper electrode 266 and the titanium electrode 267 are receded to the right side from the end part of the titanium electrode 265. Accordingly, at the end parts of the source electrode 260*a* and the drain electrode 260*b*, stair-shaped steps are formed by having the respective titanium electrodes 265 protruded inward.

On the gate insulating film 30 sandwiched between the source electrode 260*a* and the drain electrode 260*b*, a channel layer 240 made of an IGZO layer is formed. One end of the channel layer 240 is extended to the upper surface of the source electrode 260*a*, and the other end is extended to the upper surface of the drain electrode 260*b*. One end of the channel layer 240 that is in contact with the source electrode 260*a* and the other end of the channel layer 240 that is in contact with the drain electrode 260*b* are in direct contact with the titanium electrode 265 and the titanium electrode 267. Therefore, at both sides of the channel layer 240, the low resistance regions (also referred to as "first regions") 240*b* that are reduced by the titanium electrode 265 and the titanium electrode 267 are formed. At the center of the channel layer 240 sandwiched between the two low resistance regions 240*b*, a high resistance region (also referred to as a "second region") 240*a* that is not reduced remains.

The end part of the source electrode 260*a* is arranged above the left side part of the gate electrode 20, and the end part of the drain electrode 260*b* is arranged above the right side part of the gate electrode 20. Therefore, when a predetermined voltage is applied to the gate electrode 20, electrons are induced in the low resistance regions 240*b* of the channel layer 240 by the electric field from the gate electrode 20, so that the high concentration carrier layers are formed. In accordance with the forming of the high concentration carrier layers, the source electrode 260*a* and the drain electrode 260*b* are respectively brought into ohmic contact with the two low resistance regions 240*b*.

The passivation film 70 is formed to cover the whole surface of the insulating substrate 15 including the source electrode 260*a* and the drain electrode 260*b*. The passivation film 70 is made of a silicon oxide film having a film thickness of 300 nm. On the passivation film 70, the contact holes 71*a*, 71*b* that reach the surfaces of the source electrode 260*a* and the drain electrode 260*b* are formed, respectively. The source electrode 260*a* and the drain electrode 260*b* are electrically connected respectively, via the contact holes 71*a*, 71*b*, to the external wirings 80*a*, 80*b* that are formed on the passivation film 70.

In the TFT 300, the electrical channel length Le is shorter than the length Lch of the source/drain interval space. The electrical channel length Le is preferably shorter than the length Lch of the source/drain interval space by about 1 μm to 3 μm (inclusive), like in the TFT 100. By setting the electrical channel length Le shorter than the length Lch of the source/drain interval space by 1 μm to 3 μm (inclusive), the TFT 300 operates normally even when the source/drain interval space is narrowed to the resolution limit. The electrical channel length Le shown in FIG. 18(*a*) and FIG. 18(*b*) expresses the channel length of the TFT 300 when a voltage of 20 V to 30 V is applied to the gate electrode 20.

4.2 Manufacturing Method of TFT

Figure 18:
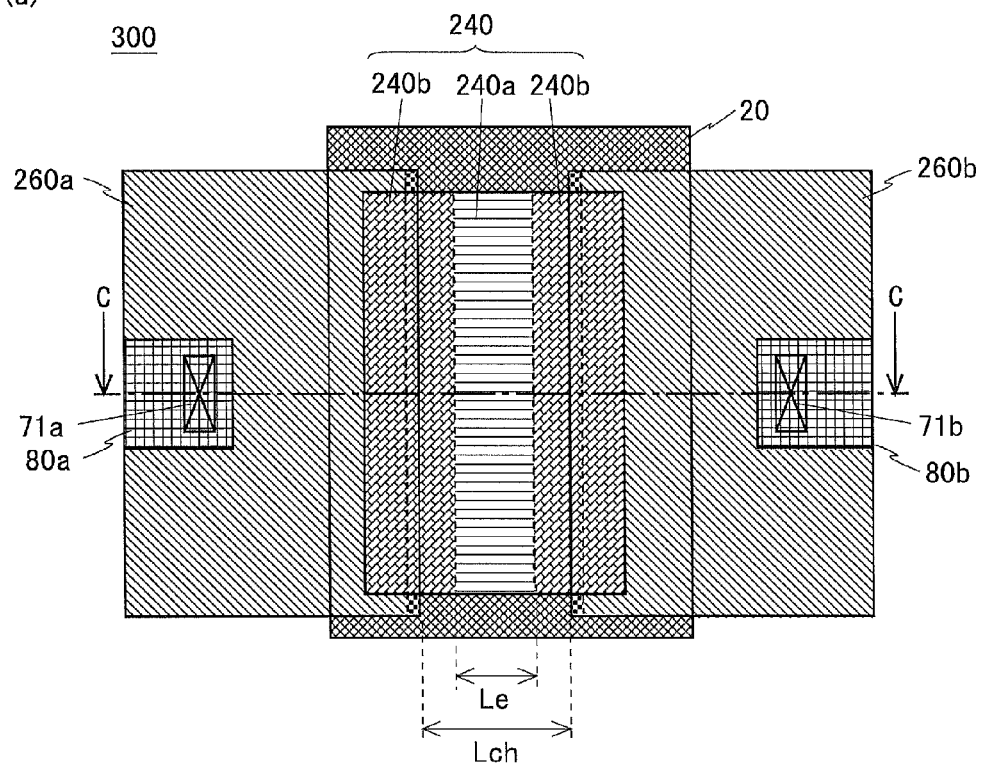
FIG. 18(a) is a plan view showing a configuration of a bottom-gate type TFT according to a third embodiment of the present invention.
FIG. 18(b) is a cross-sectional view along the C-C line of the TFT shown in FIG. 18(a).
Figure 18:
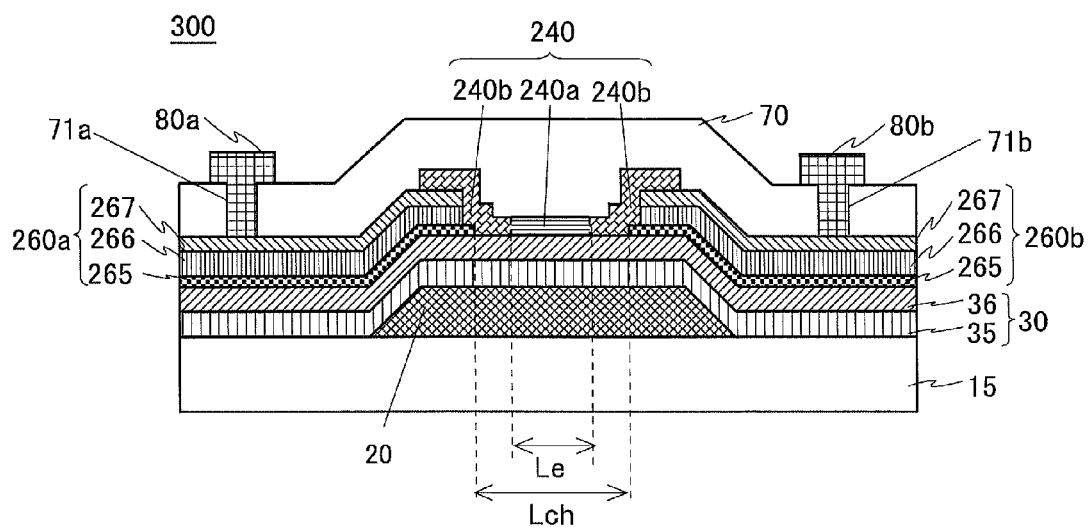
Figure 19:
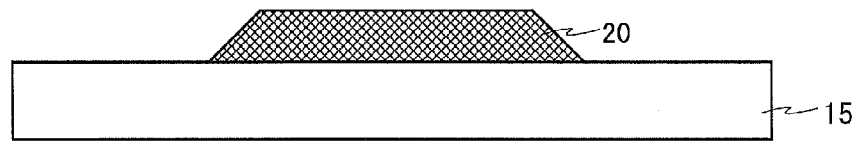
FIGS. 19(a) to 19(d) are process cross-sectional views showing the manufacturing processes of the TFT shown in FIG. 18(a) and FIG. 18(b).
Figure 19:
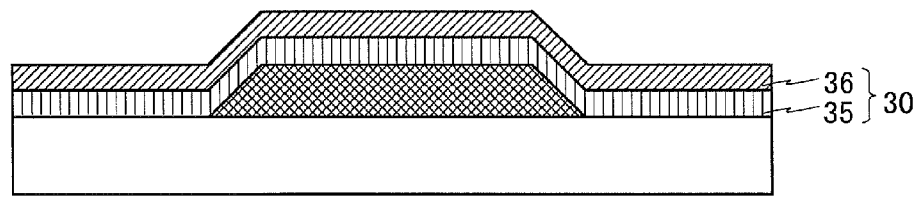
Figure 19:
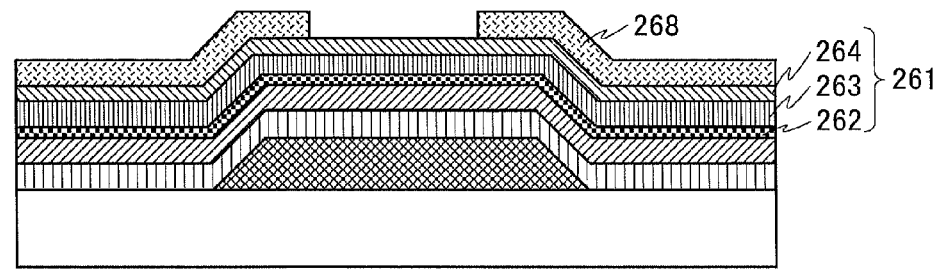
Figure 19:
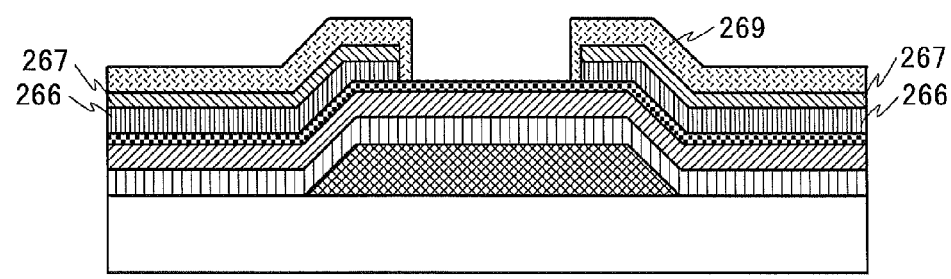
Figure 20:
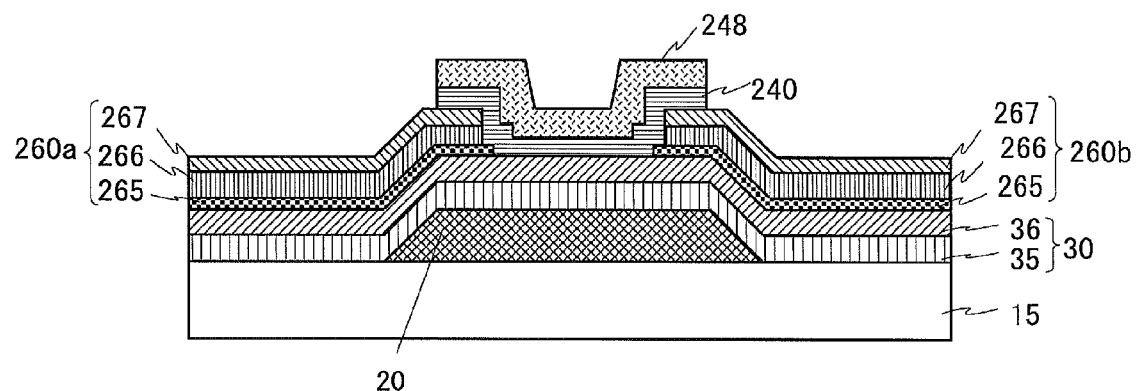
FIGS. 20(a) to 20(c) are process cross-sectional views showing the manufacturing processes of the TFT shown in FIG. 18(a) and FIG. 18(b).
Figure 20:
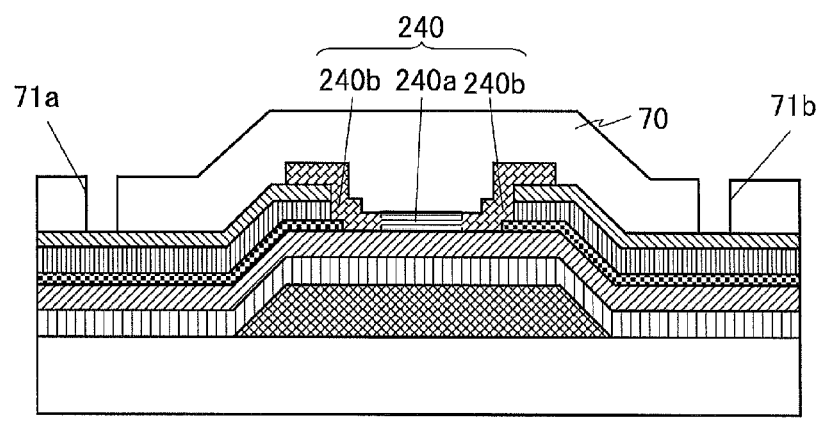
Figure 20:
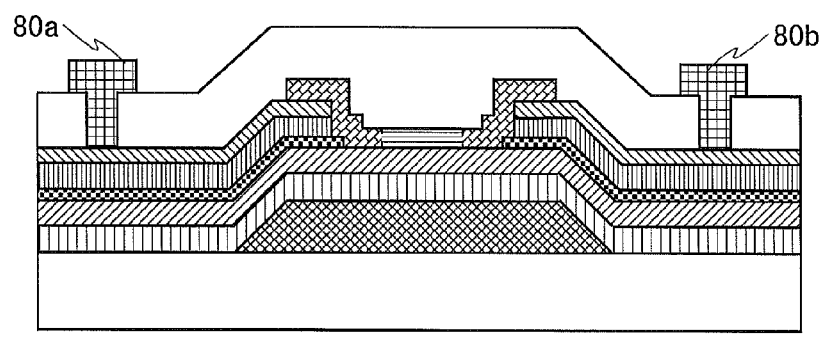

FIG. 19(*a*) to FIG. 19(*d*) and FIG. 20(*a*) to FIG. 20(*c*) are process cross-sectional views showing manufacturing processes of the TFT 300 shown in FIG. 18(*a*) and FIG. 18(*b*).

Figure 8:
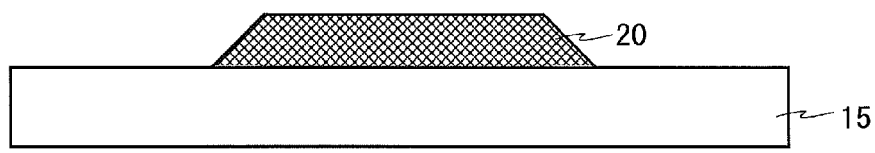
FIGS. 8(a) to 8(c) are process cross-sectional views showing the manufacturing processes of the TFT shown in FIG. 7(a) and FIG. 7(b).
Figure 8:
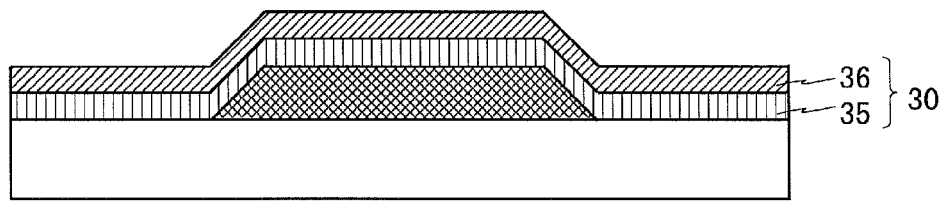
Figure 8:
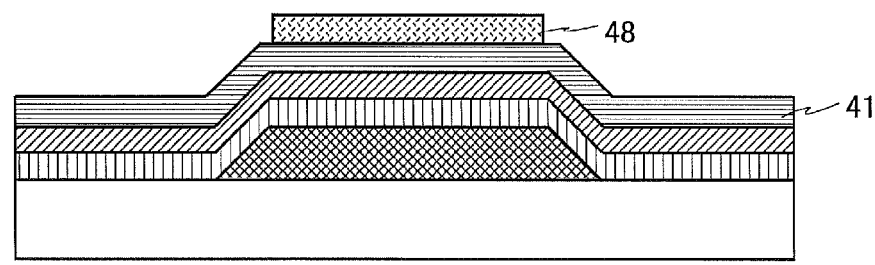

Out of the manufacturing processes of the TFT 300, the process of forming the gate electrode 20 and the process of forming the gate insulating film 30 on the insulating substrate 15 shown in FIG. 19(*a*) and FIG. 19(*b*) are the same as the processes shown in FIG. 8(*a*) and FIG. 8(*b*). Therefore, FIG. 19(*a*) and FIG. 19(*b*) are attached with the same reference marks as those in FIG. 8(*a*) and FIG. 8(*b*), and their descriptions are omitted.

As shown in FIG. 19(*c*), by using the sputtering method, a source metal film 261 is formed on the gate insulating film 30. The source metal film 261 is a laminated metal film by laminating a titanium film 262, a copper film 263, and a titanium film 264 in order. Next, on the source metal film 261, by using the photolithography method, resist patterns 268 that are separated to the left and right with a predetermined distance are formed above the gate electrode 20. By using the resist patterns 268 as masks, and by using the wet etching method, the titanium film 264 and the copper film 263 that are included in the source metal film 261 are etched in order, so that the titanium electrodes 267 and the copper electrodes 266 that are included in the source electrode 260*a* and the drain electrode 260*b* are formed.

As shown in FIG. 19(*d*), by peeling off the resist patterns 268, resist patterns 269 that cover the titanium electrodes 267 and the copper electrodes 266 and have a narrower opening than that of the resist patterns 268 are formed. By using the resist patterns 269 as masks, and by using the wet etching method, the titanium film 262 is etched, so that the titanium electrodes 265 are formed. Accordingly, the source electrode 260*a* and the drain electrode 260*b* become in structures having stair-shaped steps such that the end parts of the titanium electrodes 267 and the copper electrodes 266 are receded from the end parts of the titanium electrodes 265. The source electrode 260*a* is extended from left above the gate electrode 20 to the left side, and the drain electrode 260*b* is extended from right above the gate electrode 20 to the right side. The positional relationships between the end parts of the source electrode 260*a* and the drain electrode 260*b* and the side parts of the gate electrode 20 are the same as those in the TFT 100, and therefore, their descriptions are omitted.

As shown in FIG. 20(*a*), by using the sputtering method, an IGZO film (not shown) having a film thickness of 30 nm to 50 nm is formed. By etching the IGZO film by using the resist patterns 248 formed on the IGZO film, the channel layer 240 made of the IGZO layer is formed in the source/drain interval space. One end of the channel layer 240 is extended onto the upper surface of the source electrode 260*a*, and the other end is extended onto the upper surface of the drain electrode 260*b*. Accordingly, the left lower surface of the IGZO layer is brought into direct contact with the surfaces of the end parts of the titanium electrode 267 and the titanium electrode 265 that are included in the source electrode 260a, and the right lower surface of the IGZO layer is brought into direct contact with the surfaces of the end parts of the titanium electrode 267 and the titanium electrode 265 that are included in the drain electrode 260b.

As shown in FIG. 20(b), the passivation film 70 is formed to cover the whole surface of the insulating substrate 15 including the channel layer 240, the source electrode 260a and the drain electrode 260b. Next, on the passivation film 70, the contact holes 71a, 71b that reach respectively the surfaces of the source electrode 260a and the drain electrode 260b are formed. Because these processes are the same as those in the first embodiment, detailed descriptions are omitted.

After forming the contact holes 71a, 71b, heat treatment is performed for one hour at a temperature of 350° C. in the atmosphere. By the heat treatment, oxygen moves to the titanium electrodes 265, 267 of the source electrode 260a and the drain electrode 260b from the IGZO layer constituting the channel layer 240, so that the IGZO layer is reduced. Accordingly, the low resistance regions 240b are formed at both sides of the channel layer 240, and the IGZO layer that is sandwiched between the two low resistance regions 240b remains as the high resistance region 240a. Further, the source electrode 260a and the drain electrode 260b are recovered from damages that are generated by the etching of the contact holes 71a, 71b, and the TFT characteristic is improved. The state that the IGZO layer is reduced is described later.

The forming of the passivation film 70 to the forming of the external wirings 80a, 80b shown in FIG. 20(c) are the same as those in the TFT 100, except the heat treatment after forming the contact holes 71a, 71b. Therefore, their descriptions are omitted. By the heat treatment after forming the contact holes 71a, 71b, the low resistance regions 240b are formed at both sides of the channel layer 240, and the high resistance region 240a remains at the center of the channel layer 240 that is sandwiched between the two low resistance regions 240b. In this way, the TFT 300 shown in FIG. 18(a) and FIG. 18(b) is formed.

Figure 21:
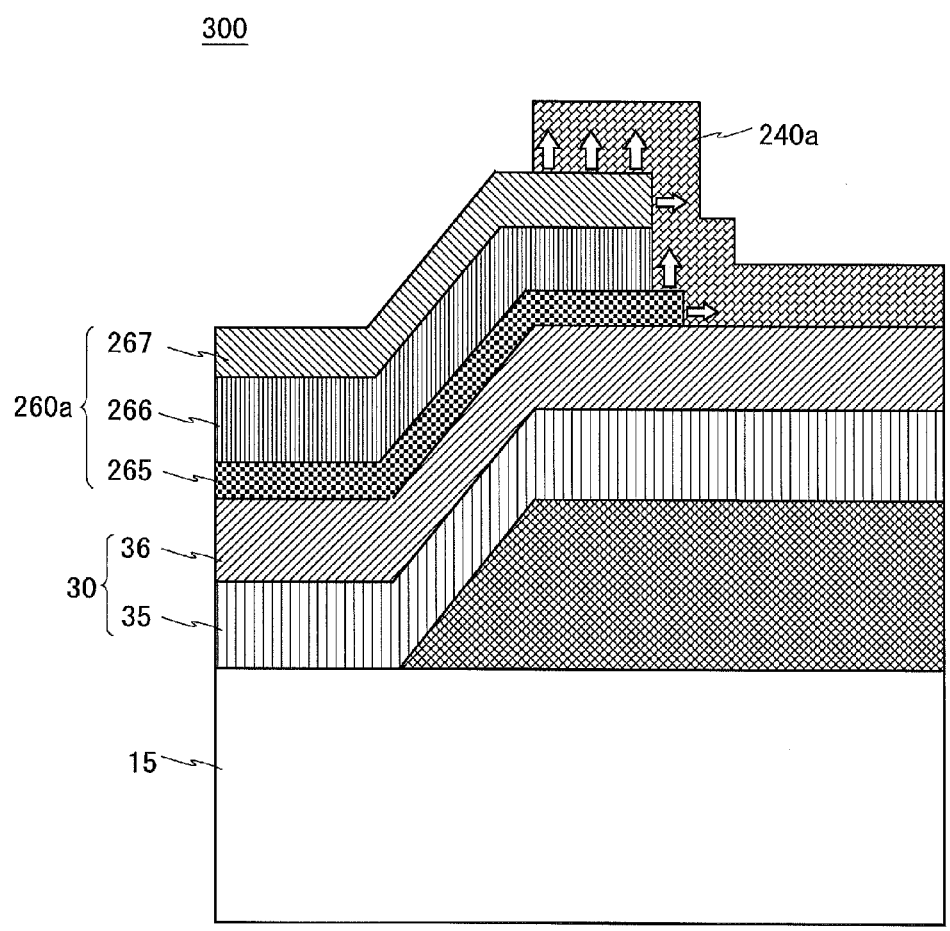

FIG. 21 is an enlarged cross-sectional view of the TFT 300 showing the state that the IGZO layer constituting the channel layer 240 is reduced by the heat treatment. As shown in FIG. 21, the IGZO layer constituting the channel layer 240 is in direct contact with the surfaces and the side surfaces of the titanium electrodes 265, 267 of the source electrode 260a. By the heat treatment, because the IGZO layer is reduced from the regions that come in direct contact with the surfaces and the side surfaces of the titanium electrodes 265, 267, the low resistance regions 240b are spread from the regions that come in contact with the titanium electrodes 265, 267, as base points.

4.3 Effects

According to the present embodiment, the current driving force of the TFT 300 can be increased, like in the TFT 100 according to the first embodiment.

4.4 Modification

In the TFT 300, the source electrode 260a and the drain electrode 260b are configured by the laminated metal film obtained by laminating the titanium electrodes 265, the copper electrodes 266, and the titanium electrodes 267 in order. However, it is sufficient that the laminated metal film includes at least either one of the titanium electrodes 265 and the titanium electrodes 267. In this case, because the area in which the IGZO layer constituting the channel layer 240 is in contact with the titanium electrodes 265, 267 decreases, the speed at which the IGZO layer is reduced becomes slow. Therefore, to set the length ΔL of the low resistance regions 240b sufficiently long, it becomes necessary to increase the temperature of the heat treatment and to increase the heat treatment time.

5. Fourth Embodiment

Figure 22:
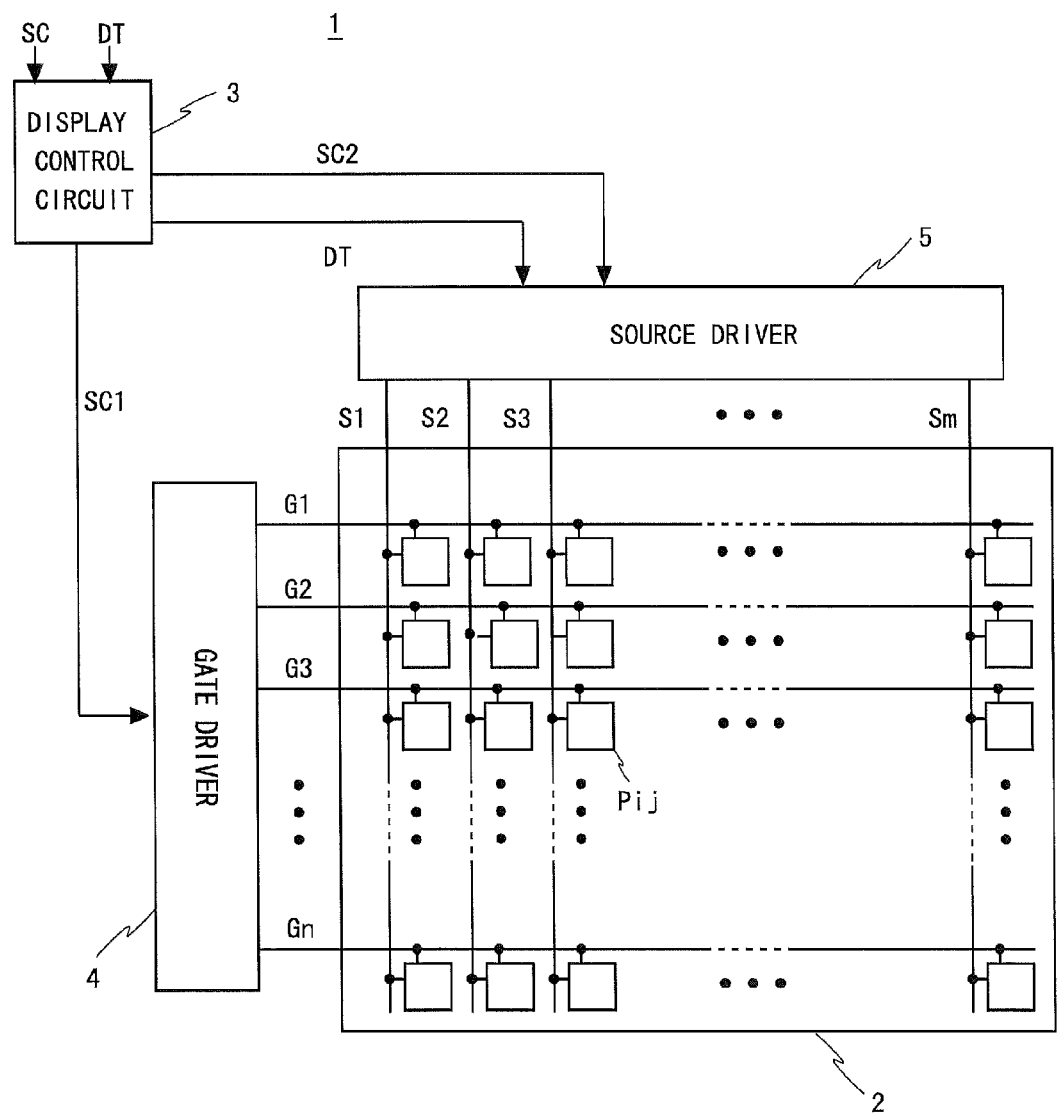
FIG. 22 is a block diagram showing a configuration of a liquid crystal display device that includes any one of the TFTs according to the first to third embodiments.

FIG. 22 is a block diagram showing a configuration of a liquid crystal display device 1 that includes any one of the TFTs 100 to 300 according to the first to third embodiments. The liquid crystal display device 1 shown in FIG. 22 includes a liquid crystal panel 2, a display control circuit 3, a gate driver 4, and a source driver 5. In the liquid crystal panel 2, there are formed n (n is an integer equal to or larger than 1) gate wirings G1 to Gn that are extended to a horizontal direction, and m (m is an integer equal to or larger than 1) source wirings S1 to Sm that are extended to a direction orthogonal to the gate wirings G1 to Gn. Near each intersection between an i-th gate wiring Gi (i is an integer equal to or larger than 1 and equal to or smaller than n) and a j-th source wiring Sj (j is an integer equal to or larger than 1 and equal to or smaller than m), a pixel formation portion Pij is arranged.

To the display control circuit 3, a control signal SC of a horizontal synchronization signal and a vertical synchronization signal and an image signal DT are supplied from the outside of the liquid crystal display device 1. On the basis of these signals, the display control circuit 3 outputs a control signal SC1 to the gate driver 4, and outputs a control signal SC2 and the image signal DT to the source driver 5.

The gate driver 4 is connected to the gate wirings G1 to Gn, and the source driver 5 is connected to the source wirings S1 to Sm. The gate driver 4 sequentially applies a high-level signal showing a selection state to the gate wirings G1 to G. Accordingly, the gate wirings G1 to Gn are selected one by one in order. For example, when the i-th gate wiring Gi is selected, pixel formation portions Pi1 to Pim for one row are collectively selected. The source driver 5 applies a signal voltage corresponding to the image signal DT to the source wirings S1 to Sm. Accordingly, the signal voltage corresponding to the image signal DT is written into the selected pixel formation portions Pi1 to Pim for one line. In this way, the liquid crystal display device 1 displays the image in the liquid crystal panel 2. The liquid crystal panel 2 is also referred to as a "display unit", and the gate driver 4 and the source driver 5 are also collectively referred to as a "drive circuit".

Figure 23:
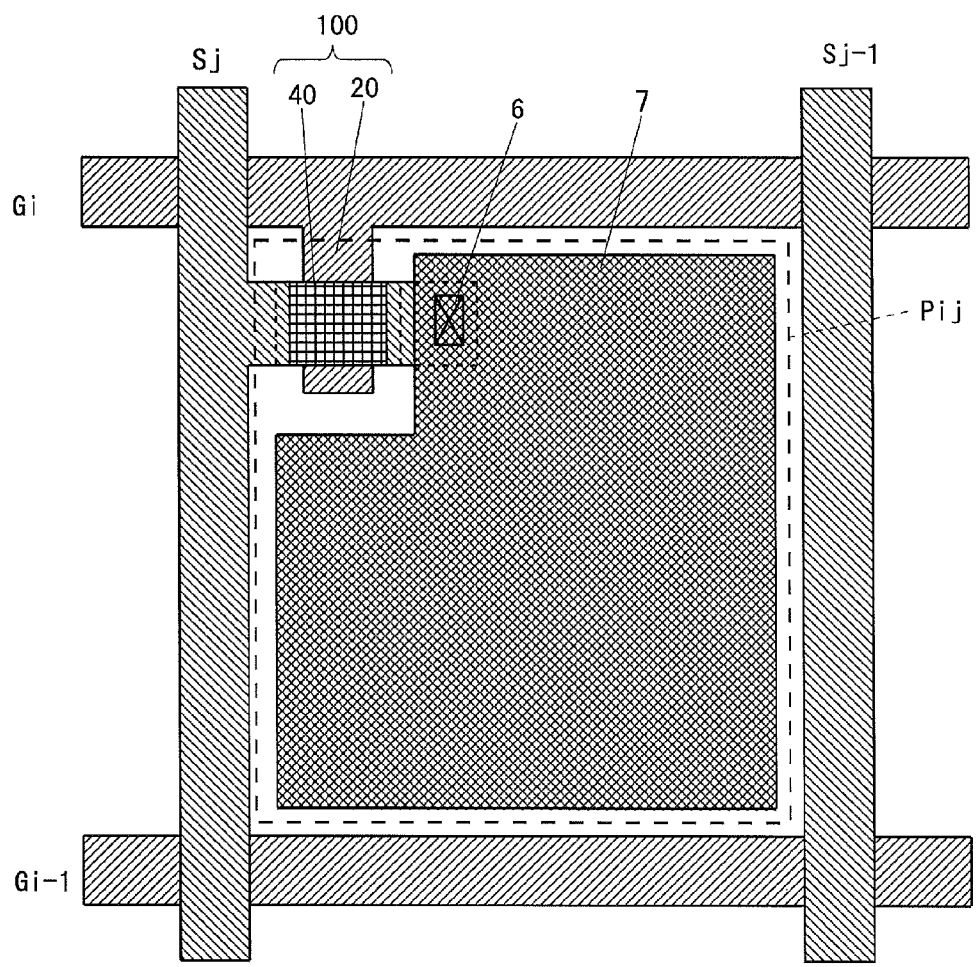
FIG. 23 is a plan view showing a pattern arrangement in the pixel formation portion that is provided in the liquid crystal panel of the liquid crystal display device shown in FIG. 22.

FIG. 23 is a plan view showing a pattern arrangement in the pixel formation portion Pij that is provided in the liquid crystal panel 2. As shown in FIG. 23, the liquid crystal panel 2 includes the i-th gate wiring Gi that is extended to the horizontal direction, the j-th source wiring Sj that is extended to the direction orthogonal to the gate wiring Gi, and the pixel formation portion Pij that is arranged in the region surrounded by the gate wiring Gi and the source wiring Sj. The pixel formation portion Pij includes the TFT 100 shown in FIG. 7(a) and FIG. 7(b) as the TFT that functions as the switching element. The gate electrode 20 of the TFT 100 is electrically connected to the gate wiring Gi. Above the gate electrode 20, the channel layer 40 having an island shape is formed. One end of the channel layer 40 is electrically connected to the source electrode that is connected to the source wiring Sj, and the other end of the channel layer 40 is electrically connected to the drain electrode. Further, the drain electrode is connected to a pixel electrode 7 via a contact hole 6. The pixel electrode 7 constitutes a pixel capacitance that holds the signal voltage corresponding to the image signal DT for a predetermined time, together with a counter electrode (not shown).

When the TFT 100 having large driving current force is used as the switching element of each pixel formation portion Pij provided in the liquid crystal panel 2, the TFT 100 can charge the signal voltage of the image signal DT given from the source wiring Sj, to the pixel capacitance in a short time. Accordingly, the number of the pixel formation portions Pij can be increased, and therefore, high definition can be achieved.

By using the TFT 100, the gate driver 4 and the source driver 5 can be also formed in the picture-frame of the liquid crystal panel 2. In this case, because the on current of the TFT 100 is large, the operation speed of the gate driver 4 and the source driver 5 becomes fast, and a high frame rate can be realized. Further, because the circuit scale of the gate driver 4 and the source driver 5 can be made small, the picture-frame of the liquid crystal panel 2 can be made small, and the power consumption of the liquid crystal display device 1 can be reduced.

Although the case of using the TFT 100 is described with reference to FIG. 22 and FIG. 23, the TFT 200 or the TFT 300 may be used instead of the TFT 100.

Although the case of applying the TFT 100 to the liquid crystal display device 1 is described above, the TFT 100 can be also applied to an organic EL (Electro Luminescence) display device.

INDUSTRIAL APPLICABILITY

The present invention is suitable for a thin film transistor that is used in a display device such as an active matrix-type liquid crystal display device, and is particularly suitable for a switching element that is formed in the image formation portion of this transistor, or a transistor of a drive circuit that drives the pixel formation portion.

DESCRIPTION OF REFERENCE CHARACTERS

1: LIQUID CRYSTAL DISPLAY DEVICE
2: LIQUID CRYSTAL PANEL
4: GATE DRIVER
5: SOURCE DRIVER
20: GATE ELECTRODE
30: GATE INSULATING FILM
40: CHANNEL LAYER (IGZO LAYER)
40a, 240a: HIGH RESISTANCE REGIONS
40b, 240b: LOW RESISTANCE REGIONS
60a, 160a, 260a: SOURCE ELECTRODES
60b, 160b, 260b: DRAIN ELECTRODES
65, 165, 265, 267: TITANIUM ELECTRODES
71a, 71b, 151a, 151b: CONTACT HOLES
100, 200, 300: THIN FILM TRANSISTORS
150, 150C: ETCHING STOPPER LAYERS

The invention claimed is:

1. A thin film transistor formed on an insulating substrate, comprising:
a gate electrode formed on the insulating substrate;
a gate insulating film formed to cover the gate electrode;
a source electrode and a drain electrode that are formed on the gate insulating film with a predetermined distance to sandwich the gate electrode; and
a channel layer that includes an oxide semiconductor layer which is formed on the gate insulating film sandwiched between the source electrode and the drain electrode, and one end and the other end being electrically connected respectively to the source electrode and the drain electrode, wherein
the oxide semiconductor layer has two first regions each having a first resistance value, and a second region sandwiched between the two first regions and having a second resistance value higher than the first resistance values,
a length of the second region is shorter than a length between an end part of the source electrode and an end part of the drain electrode,
the source electrode and the drain electrode include at least one metal electrode which takes oxygen away from the oxide semiconductor layer and also supplies hydrogen to the oxide semiconductor layer, and are made of laminated metal electrodes obtained by laminating a plurality of metal electrodes,
the laminated metal electrodes have stair-shaped steps that are formed to have at least a part of surfaces of the plurality of metal electrodes exposed, and
one end and the other end of the oxide semiconductor layer are formed to cover the stair-shaped steps.

2. The thin film transistor according to claim 1, wherein when a predetermined voltage is applied to the gate electrode, the length of the second region becomes longer by a length of the first region which becomes short.

3. The thin film transistor according to claim 1, wherein the metal electrode is a titanium electrode.

4. The thin film transistor according to claim 3, wherein the oxide semiconductor layer is an indium gallium zinc oxide layer, and the titanium electrode is in direct contact with the indium gallium zinc oxide layer.

5. The thin film transistor according to claim 4, wherein the length of the second region when a voltage is applied to the gate electrode is shorter than the length between the end part of the source electrode and the end part of the drain electrode by 1 μm to 3 μm (inclusive).

6. The thin film transistor according to claim 1, wherein the oxide semiconductor layer is made of a microcrystalline oxide semiconductor.

7. An active matrix-type display device that displays an image, comprising:
a display unit including a plurality of gate wirings, a plurality of source wirings orthogonal to the plurality of gate wirings, a plurality of pixel formation portions arranged in a matrix in accordance with intersections between the plurality of gate wirings and the plurality of source wirings; and
a drive circuit that drives the plurality of pixel formation portions, wherein
the drive circuit is configured by the thin film transistor according to claim 1.

8. An active matrix-type display device that displays an image, comprising:
a display unit including a plurality of gate wirings, a plurality of source wirings orthogonal to the plurality of gate wirings, a plurality of pixel formation portions arranged in a matrix in accordance with intersections between the plurality of gate wirings and the plurality of source wirings; and
a drive circuit that drives the plurality of pixel formation portions, wherein
the pixel formation portions include switching elements that are turned on or off according to signals applied to corresponding gate wirings, and
the switching elements include the thin film transistor according to claim 1.

9. A thin film transistor formed on an insulating substrate, comprising:
a gate electrode formed on the insulating substrate;
a gate insulating film formed to cover the gate electrode;
a source electrode and a drain electrode that are formed on the gate insulating film with a predetermined distance to sandwich the gate electrode; and
a channel layer that includes an oxide semiconductor layer which is formed on the gate insulating film sandwiched between the source electrode and the drain electrode, and one end and the other end being electrically connected respectively to the source electrode and the drain electrode, wherein
the oxide semiconductor layer is an indium gallium zinc oxide layer, and has two first regions each having a first resistance value, and a second region sandwiched between the two first regions and having a second resistance value higher than the first resistance values,
a length of the second region is shorter than a length between an end part of the source electrode and an end part of the drain electrode,
the source electrode and the drain electrode respectively include at least one titanium electrode which takes oxygen away from the oxide semiconductor layer and also supplies hydrogen to the oxide semiconductor layer, and
the titanium electrodes are in direct contact with the indium gallium zinc oxide layer.

10. The thin film transistor according to claim 9, wherein the source electrode is formed to cover one end of the indium gallium zinc oxide layer, and the drain electrode is formed to cover the other end of the indium gallium zinc oxide layer.

11. The thin film transistor according to claim 10, further comprising an etching stopper layer which is formed to cover the second region, on the oxide semiconductor layer sandwiched between the end part of the source electrode and the end part of the drain electrode, and
the source electrode and the drain electrode are connected respectively to the two first regions of the channel layer via contact holes formed on the etching stopper layer.

12. The thin film transistor according to claim 9, wherein one end of the indium gallium zinc oxide layer is formed to cover one end of the source electrode, and the other end of the indium gallium zinc oxide layer is formed to cover one end of the drain electrode.

13. The thin film transistor according to claim 12, wherein the source electrode and the drain electrode include at least titanium electrode which takes oxygen away from the oxide semiconductor layer and also supplies hydrogen to the oxide semiconductor layer, and are made of laminated metal electrodes obtained by laminating a plurality of metal electrodes,
the laminated metal electrodes have stair-shaped steps that are formed to have at least a part of surfaces of the plurality of metal electrodes exposed, and
one end and the other end of the indium gallium zinc oxide layer are formed to cover the stair-shaped steps.

14. The thin film transistor according to claim 9, wherein when a predetermined voltage is applied to the gate electrode, the length of the second region becomes longer by a length of the first region which becomes short.

15. The thin film transistor according to claim 9, wherein the length of the second region when a voltage is applied to the gate electrode is shorter than the length between the end part of the source electrode and the end part of the drain electrode by 1 µm to 3 µm (inclusive).

16. The thin film transistor according to claim 9, wherein the indium gallium zinc oxide layer is made of a microcrystalline oxide semiconductor.

17. An active matrix-type display device that displays an image, comprising:
a display unit including a plurality of gate wirings, a plurality of source wirings orthogonal to the plurality of gate wirings, a plurality of pixel formation portions arranged in a matrix in accordance with intersections between the plurality of gate wirings and the plurality of source wirings; and
a drive circuit that drives the plurality of pixel formation portions, wherein
the drive circuit is configured by the thin film transistor according to claim 9.

18. An active matrix-type display device that displays an image, comprising:
a display unit including a plurality of gate wirings, a plurality of source wirings orthogonal to the plurality of gate wirings, a plurality of pixel formation portions arranged in a matrix in accordance with intersections between the plurality of gate wirings and the plurality of source wirings; and
a drive circuit that drives the plurality of pixel formation portions, wherein
the pixel formation portions include switching elements that are turned on or off according to signals applied to corresponding gate wirings, and
the switching elements include the thin film transistor according to claim 9.

* * * * *